(12) United States Patent
Fondurulia et al.

(10) Patent No.: US 8,137,462 B2
(45) Date of Patent: Mar. 20, 2012

(54) PRECURSOR DELIVERY SYSTEM

(75) Inventors: Kyle Fondurulia, Phoenix, AZ (US); Eric Shero, Phoenix, AZ (US); Mohith E Verghese, Phoenix, AZ (US); Carl L White, Gilbert, AZ (US)

(73) Assignee: ASM America, Inc., Phoenix, AZ (US)

( * ) Notice: Subject to any disclaimer, the term of this patent is extended or adjusted under 35 U.S.C. 154(b) by 1196 days.

(21) Appl. No.: 11/870,374

(22) Filed: Oct. 10, 2007

(65) Prior Publication Data

US 2008/0085226 A1 Apr. 10, 2008

Related U.S. Application Data

(60) Provisional application No. 60/850,886, filed on Oct. 10, 2006.

(51) Int. Cl.
*C23C 16/00* (2006.01)
*C23C 16/455* (2006.01)
*C23C 16/448* (2006.01)

(52) U.S. Cl. .................. 118/715; 118/724; 118/726

(58) Field of Classification Search .......... 118/715, 118/726, 724
See application file for complete search history.

(56) References Cited

U.S. PATENT DOCUMENTS

| | | | | |
|---|---|---|---|---|
| 4,393,013 A | * | 7/1983 | McMenamin | 261/64.3 |
| 4,436,674 A | * | 3/1984 | McMenamin | 261/64.3 |
| 4,722,298 A | * | 2/1988 | Rubin et al. | 118/715 |
| 4,883,362 A | | 11/1989 | Gartner et al. | |
| 4,947,790 A | | 8/1990 | Gartner et al. | |
| 5,199,603 A | | 4/1993 | Prescott | |
| 5,380,367 A | * | 1/1995 | Bertone | 118/726 |
| 5,732,744 A | * | 3/1998 | Barr et al. | 138/106 |
| 5,836,483 A | * | 11/1998 | Disel | 222/396 |
| 5,904,771 A | | 5/1999 | Tasaki et al. | |
| 6,083,321 A | * | 7/2000 | Lei et al. | 118/719 |

(Continued)

FOREIGN PATENT DOCUMENTS

GB 2 151 662 7/1985

(Continued)

OTHER PUBLICATIONS

Partial International Search Report on claims 1-9 from the International Searching Authority dated Apr. 15, 2008, in corresponding International Patent Application No. PCT/US2007/081005.

*Primary Examiner* — Jeffrie R Lund
(74) *Attorney, Agent, or Firm* — Knobbe Martens Olson & Bear LLP

(57) ABSTRACT

A precursor source vessel comprises a vessel body, a passage within the vessel body, and a valve attached to a surface of the body. An internal chamber is adapted to contain a chemical reactant, and the passage extends from outside the body to the chamber. The valve regulates flow through the passage. The vessel has inlet and outlet valves, and optionally a vent valve for venting internal gas. An external gas panel can include at least one valve fluidly interposed between the outlet valve and a substrate reaction chamber. Gas panel valves can each be positioned along a plane that is generally parallel to, and no more than about 10.0 cm from, a flat surface of the vessel. Filters in a vessel lid or wall filter gas flow through the vessel's valves. A quick-connection assembly allows fast and easy connection of the vessel to a gas panel.

19 Claims, 25 Drawing Sheets

U.S. PATENT DOCUMENTS

| | | | |
|---|---|---|---|
| 6,270,839 B1 | 8/2001 | Onoe et al. | |
| 6,312,525 B1 * | 11/2001 | Bright et al. | 118/719 |
| 6,718,126 B2 | 4/2004 | Lei | |
| 6,889,864 B2 * | 5/2005 | Lindfors et al. | 220/320 |
| 6,905,541 B2 | 6/2005 | Chen et al. | |
| 6,909,839 B2 * | 6/2005 | Wang et al. | 392/389 |
| 7,018,478 B2 | 3/2006 | Lindfors et al. | |
| 7,186,385 B2 | 3/2007 | Ganguli et al. | |
| 7,270,709 B2 | 9/2007 | Chen et al. | |
| 7,437,060 B2 * | 10/2008 | Wang et al. | 392/389 |
| 7,833,353 B2 * | 11/2010 | Furukawahara et al. | 118/726 |
| 2002/0108670 A1 * | 8/2002 | Baker et al. | 141/18 |
| 2004/0016404 A1 | 1/2004 | Gregg et al. | |
| 2005/0000428 A1 | 1/2005 | Shero et al. | |
| 2005/0019026 A1 * | 1/2005 | Wang et al. | 392/389 |
| 2005/0066893 A1 | 3/2005 | Soininen | |
| 2005/0072357 A1 | 4/2005 | Shero et al. | |
| 2005/0263075 A1 * | 12/2005 | Wang et al. | 118/726 |
| 2008/0085226 A1 * | 4/2008 | Fondurulia et al. | 422/198 |
| 2008/0149031 A1 * | 6/2008 | Chu et al. | 118/726 |
| 2009/0136668 A1 * | 5/2009 | Gregg et al. | 427/255.28 |
| 2010/0322604 A1 * | 12/2010 | Fondurulia et al. | 392/451 |

FOREIGN PATENT DOCUMENTS

| | | |
|---|---|---|
| JP | 64-064314 | 3/1989 |
| JP | 1265511 | 10/1989 |
| JP | 09-040489 | 2/1997 |
| JP | 11-168092 A | 6/1999 |
| WO | WO 2007/057631 | 5/2007 |

* cited by examiner

PRECURSOR DELIVERY SYSTEM

CLAIM FOR PRIORITY

The present application claims priority under 35 U.S.C. 119(e) to U.S. Provisional Patent Application No. 60/850,886, filed Oct. 10, 2006.

BACKGROUND

1. Field

The present application relates generally to semiconductor processing equipment and specifically to apparatus for delivering reactant gases to processing chambers.

2. Description of the Related Art

Chemical vapor deposition (CVD) is a known process in the semiconductor industry for forming thin films of materials on substrates such as silicon wafers. In CVD, reactant gases (also referred to herein as "precursor gases") of different reactants are delivered to one or more substrates in a reaction chamber. In many cases, the reaction chamber includes only a single substrate supported on a substrate holder (such as a susceptor), with the substrate and substrate holder being maintained at a desired process temperature. The reactant gases react with one another to form thin films on the substrate, with the growth rate being controlled either by the temperature or the amounts of reactant gases.

In some applications, the reactant gases are stored in gaseous form in a reactant source vessel. In such applications, the reactant vapors are often gaseous at ambient (i.e., normal) pressures and temperatures. Examples of such gases include nitrogen, oxygen, hydrogen, and ammonia. However, in some cases, the vapors of source chemicals ("precursors") that are liquid or solid (e.g., hafnium chloride) at ambient pressure and temperature are used. These source chemicals may have to be heated to produce sufficient amounts of vapor for the reaction process. For some solid substances (referred to herein as "solid source precursors"), the vapor pressure at room temperature is so low that they have to be heated to produce a sufficient amount of reactant vapor and/or maintained at very low pressures. Once vaporized, it is important that the vapor phase reactant is kept at or above the vaporizing temperature through the processing system so as to prevent undesirable condensation in the valves, filters, conduits, and other components associated with delivering the vapor phase reactants to the reaction chamber. Vapor phase reactants from such naturally solid or liquid substances are useful for chemical reactions in a variety of other industries.

Atomic layer deposition (ALD) is another known process for forming thin films on substrates. In many applications, ALD uses a solid and/or liquid source chemical as described above. ALD is a type of vapor deposition wherein a film is built up through self-saturating reactions performed in cycles. The thickness of the film is determined by the number of cycles performed. In an ALD process, gaseous precursors are supplied, alternatingly and repeatedly, to the substrate or wafer to form a thin film of material on the wafer. One reactant adsorbs in a self-limiting process on the wafer. A different, subsequently pulsed reactant reacts with the adsorbed material to form a single molecular layer of the desired material. Decomposition may occur through reaction with an appropriately selected reagent, such as in a ligand exchange or a gettering reaction. In a typical ALD reaction, no more than a molecular monolayer forms per cycle. Thicker films are produced through repeated growth cycles until the target thickness is achieved.

A typical solid or liquid source precursor delivery system includes a solid or liquid source precursor vessel and a heating means (e.g., radiant heat lamps, resistive heaters, etc.). The vessel includes the solid (e.g., in powder form) or liquid source precursor. The heating means heats up the vessel to increase the vapor pressure of precursor gas in the vessel. The vessel has an inlet and an outlet for the flow of an inert carrier gas (e.g., $N_2$) through the vessel. The carrier gas sweeps precursor vapor along with it through the vessel outlet and ultimately to a substrate reaction chamber. The vessel typically includes isolation valves for fluidly isolating the contents of the vessel from the vessel exterior. Ordinarily, one isolation valve is provided upstream of the vessel inlet, and another isolation valve is provided downstream of the vessel outlet. Precursor source vessels are normally supplied with tubes extending from the inlet and outlet, isolation valves on the tubes, and fittings on the valves, the fittings being configured to connect to the gas flow lines of the remaining substrate processing apparatus. It is often desirable to provide a number of additional heaters for heating the various valves and gas flow lines between the precursor source vessel and the reaction chamber, to prevent the precursor gas from condensing and depositing on such components. Accordingly, the gas-conveying components between the source vessel and the reaction chamber are sometimes referred to as a "hot zone" in which the temperature is maintained above the vaporization/condensation temperature of the precursor.

It is known to provide a serpentine or tortuous flow path for the flow of carrier gas while it is exposed to a solid or liquid precursor source. For example, U.S. Pat. Nos. 4,883,362; 7,122,085; and 7,156,380 each disclose such a serpentine path.

SUMMARY

In one aspect, a chemical reactant source vessel comprises a vessel body, a passage within the vessel body, and a valve attached directly to a surface of the vessel body. The vessel body defines an internal chamber adapted to contain a solid or liquid chemical reactant, and the passage extends from outside the vessel body to the chamber. The valve is configured to regulate flow through the passage.

In another aspect, a gas delivery system for a vapor phase reactor for vapor processing of substrates comprises a vapor phase reaction chamber for processing substrates, a vessel adapted to contain a solid or liquid chemical reactant, an inlet valve connected to a generally flat surface of the vessel, an outlet valve connected to the generally flat surface of the vessel, a gas flow path through the vessel from the inlet valve to the outlet valve, and a plurality of gas panel valves. The gas flow path is configured to convey a gas so as to contact a solid or liquid chemical reactant contained within the vessel. The gas panel valves include at least one valve downstream of the outlet valve and fluidly interposed between the outlet valve and the reaction chamber. The gas panel valves are each positioned along a plane that is generally parallel to the flat surface of the vessel, the plane being no more than about 10.0 cm from the flat surface of the vessel.

In another aspect, a chemical reactant source vessel comprises a container, a valve, and a filter. The container defines an internal chamber adapted to contain a solid or liquid chemical reactant. A wall of the container has a passage extending to the chamber from outside the container. The valve is attached to the wall and is adapted to regulate gas flow to and from the chamber through the passage. The filter is in the wall and is adapted to prevent particulate matter from flowing through the passage.

In yet another aspect, a gas delivery system for a vapor phase reactor for vapor processing of substrates comprises a vapor phase reaction chamber for processing substrates, a vessel adapted to contain a solid or liquid chemical reactant, an outlet valve connected to the vessel, a gas delivery system for delivering reactant gas flow from the outlet valve to the reaction chamber, a vapor exhaust component downstream of the reaction chamber, a vent valve connected to the vessel, and one or more conduits for delivering gas flow from the vent valve to the exhaust component without flowing through the gas delivery system or the reaction chamber.

In still another aspect, an apparatus for connecting a chemical reactant source vessel to a gas interface assembly of a vapor phase reactor for vapor processing of substrates is provided. The apparatus comprises a vessel, a gas interface assembly of a vapor phase reactor, and a connection assembly for connecting the vessel to the gas interface assembly. The vessel has a chamber adapted to contain a solid or liquid chemical reactant. The vessel includes an inlet and an outlet in fluid communication with the chamber. The gas interface assembly has a gas inlet adapted to connect to the outlet of the vessel chamber. The connection assembly comprises a track component and a lift assembly. The track component includes one or more elongated tracks adapted to movably engage one or more track engagement members of the vessel. The lift assembly is configured to move the track component vertically between a lowered position and a raised position. When the vessel's one or more track engagement members engage the one or more tracks of the track component, and when the lift assembly moves the track component to its raised position, the vessel's outlet becomes positioned to substantially directly fluidly communicate with the gas inlet of the gas interface assembly.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

These and other aspects of the invention will be readily apparent to the skilled artisan in view of the description below, the appended claims, and from the drawings, which are intended to illustrate and not to limit the invention, and wherein:

DETAILED DESCRIPTION OF THE PREFERRED EMBODIMENTS

The present application for letters patent discloses improved precursor source vessels, apparatuses and methods for loading and connecting the vessels to a reactor, and interfaces for using the vessels with vapor processing reactors. The disclosed embodiments provide excellent access to reactant vapor, reduced contamination of the reactor's gas delivery system, and improved serviceability (e.g., replacement or recharging) of the precursor source vessel.

The following detailed description of the preferred embodiments and methods details certain specific embodiments to assist in understanding the claims. However, one may practice the present invention in a multitude of different embodiments and methods, as defined and covered by the claims.

Gas Delivery System Overview

Figure 1:
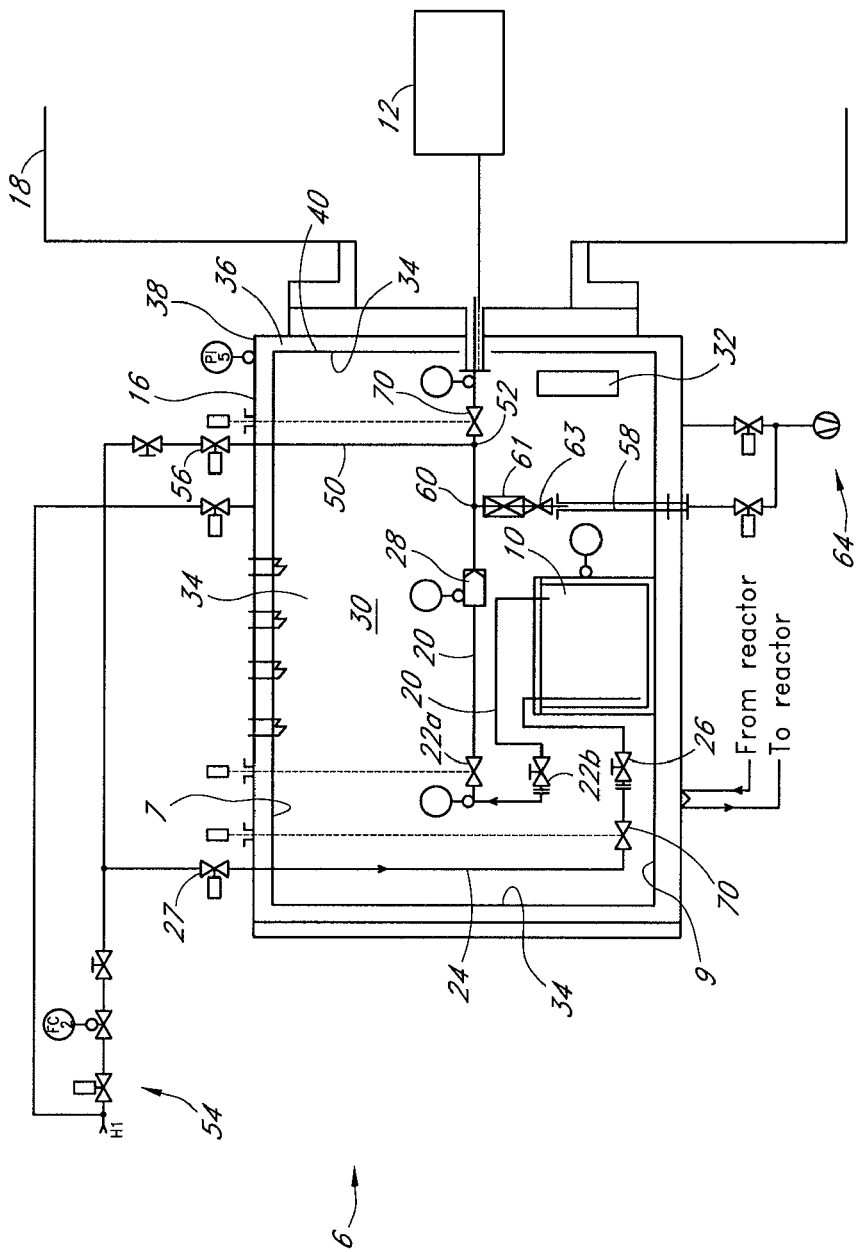
FIG. 1 is a schematic illustration of a conventional precursor source assembly and a reactor chamber assembly.

FIG. 1 schematically illustrates a conventional precursor delivery system 6 for feeding a gas phase reactant generated from a solid or liquid precursor source vessel 10 into a gas phase reaction chamber 12. Skilled artisans will understand that the precursor delivery systems of the present invention may incorporate many of the aspects of the gas delivery system 6 of FIG. 1. Accordingly, the conventional delivery system 6 is now described in order to better understand the invention.

With reference to FIG. 1, the solid or liquid source vessel 10 contains a solid or liquid source precursor (not shown). A solid source precursor is a source chemical that is solid under standard conditions (i.e., room temperature and atmospheric pressure). Similarly, a liquid source precursor is a source chemical that is liquid under standard conditions. The precursor is vaporized within the source vessel 10, which may be maintained at or above a vaporizing temperature. The vaporized reactant is then fed into the reaction chamber 12. The reactant source vessel 10 and the reaction chamber 12 can be located in a reactant source cabinet 16 and a reaction chamber vessel 18, respectively, which are preferably individually evacuated and/or thermally controlled. This can be achieved by providing these components with separate cooling and heating devices, insulation, and/or isolation valves and associated piping, as known in the art.

The illustrated gas delivery system 6 is particularly suited for delivering vapor phase reactants to be used in a vapor phase reaction chamber. The vapor phase reactants can be used for deposition (e.g., CVD) or Atomic Layer Deposition (ALD).

As seen in FIG. 1, the reactant source vessel 10 and the reaction chamber 12 are adapted to be in selective fluid communication with each other through a first conduit 20 so as to feed the gas phase reactant from the reactant source vessel 10 to the reaction chamber 12 (such as an ALD reaction chamber). The first conduit 20 includes one or more isolation valves 22a, 22b, which may be used for separating the gas spaces of the reactant source vessel 10 and the reaction chamber 12 during evacuation and/or maintenance of either or both of the reactant source vessel 10 and the reaction chamber vessel 18.

Inactive or inert gas is preferably used as a carrier gas for the vaporized precursor. The inert gas (e.g., nitrogen or argon) may be fed into the precursor source vessel 10 through a second conduit 24. The reactant source vessel 10 includes at least one inlet for connection to the second conduit 24 and at least one outlet for withdrawing gas from the vessel 10. The outlet of the vessel 10 is connected to the first conduit 20. The vessel 10 can be operated at a pressure in excess of the pressure of the reaction chamber 12. Accordingly, the second conduit 24 includes at least one isolation valve 26, which can be used for fluidly isolating the interior of the vessel 10 during maintenance or replacement of the vessel. A control valve 27 is preferably positioned in the second conduit 24 outside of the reactant source cabinet 16.

In another variation (which can be employed in embodiments of the present invention), the precursor vapor can be drawn to the reaction chamber 12 by applying a vacuum to the reactant source vessel 10, without using a carrier gas. This is sometimes referred to as "vapor draw."

In yet another variation (which can also be employed in embodiments of the present invention), the precursor vapor can be drawn out of the vessel 10 by an external gas flow that creates a lower pressure outside of the vessel, as in a Venturi effect. For example, the precursor vapor can be drawn by flowing a carrier gas toward the reaction chamber 12 along a path downstream of the vessel 10. Under some conditions, this can create a pressure differential between the vessel 10 and the flow path of the carrier gas. This pressure differential causes the precursor vapor to flow toward the reaction chamber 12.

In order to remove dispersed solid particles when a solid source precursor is used, the gas delivery system 6 includes a purifier 28 through which the vaporized reactant is conducted. The purifier 28 may comprise one or more of a wide variety of purifying devices, such as mechanical filters, ceramic molecular sieves, and electrostatic filters capable of separating dispersed solids or particles or molecules of a minimum molecular size from the reactant gas flow. It is also known to provide an additional purifier in the vessel 10. In particular, U.S. Published Patent Application No. US 2005/0000428A1 discloses a vessel comprising a glass crucible enclosed within a steel container, the crucible containing the reactant source and having a lid with a filter. The lid is separate from a vessel lid that attaches to the steel container.

With continued reference to FIG. 1, the reactant source vessel 10 is positioned within the reactant source cabinet 16. The interior space 30 of the cabinet 16 can be kept at a reduced pressure (e.g., 1 mTorr to 10 Torr, and often about 500 mTorr) to promote radiant heating of the components within the cabinet 16 and to thermally isolate such components from each other to facilitate uniform temperature fields. In other variations, the cabinet is not evacuated and includes convection-enhancing devices (e.g., fans, cross-flows, etc.). The illustrated cabinet 16 includes one or more heating devices 32, such as radiation heaters. Also, reflector sheets 34 can be provided, which may be configured to surround the components within the cabinet 16 to reflect the radiant heat generated by the heating devices 32 to the components positioned within the cabinet 16. Reflector sheets 34 can be provided on the inner walls 40 of the cabinet 16, as well as on the cabinet's ceiling 7 and floor 9. In the illustrated apparatus, a substantial length of the first conduit 20 is contained within the reactant source cabinet 16. Thus the first conduit 20 will inherently receive some heat to prevent condensation of reactant vapors.

The reactant source cabinet 16 can include a cooling jacket 36 formed between an outer wall 38 and an inner wall 40 of the cabinet. The cooling jacket 36 can contain water or another coolant. The jacket 36 allows the outer surface 38 of the cabinet 16 to be maintained at or near ambient temperatures.

In order to prevent or reduce gas flow from the reactant source vessel 10 between the alternating pulses of an ALD process, it is possible to form an inactive gas barrier in the first conduit 20. This is also sometimes referred to as "inert gas valving" or a "diffusion barrier" in a portion of the first conduit 20 to prevent flow of reactant from the reactant source vessel 10 to the reaction chamber 12 by forming a gas phase barrier by flowing gas in the opposite direction to the normal reactant flow in the first conduit 20. The gas barrier can be formed by feeding inactive gas into the first conduit 20 via a third conduit 50 connected to the conduit 20 at a connection point 52. The third conduit 50 can be connected to an inert gas source 54 that supplies the second conduit 24. During the time intervals between the feeding of vapor-phase pulses from the reactant source vessel 10, inactive gas is preferably fed into the first conduit 20 through the third conduit 50. This gas can be withdrawn via a fourth conduit 58, which is connected to the first conduit 20 at a second connection point 60 located upstream of the first connection point 52 (i.e., closer to the reactant source vessel 10). In this manner, an inert gas flow of an opposite direction to the normal reactant gas flow is achieved (between reactant pulses) in the first conduit 20 between the first and second connection points 52, 60. The fourth conduit 58 can be in communication with an evacuation source 64 (such as a vacuum pump). A restriction 61 and valves 56, 63, and 70 can also be provided. Further details of the gas delivery system 6 are illustrated and described in U.S. Published Patent Application No. US 2005/0000428A1.

Existing solid or liquid precursor source delivery systems, such as the system 6 shown in FIG. 1, have a number of drawbacks and limitations. One drawback is that it is sometimes necessary to provide a large number of additional heaters to heat up the gas lines and valves between the precursor source vessel (such as the vessel 10) and the reaction chamber (such as the reaction chamber 12). In particular, it is normally desirable to maintain all of these intervening gas-conveying components (e.g., the valves 22a, 22b, 70, purifier 28, conduit 20) at a temperature above the condensation temperature of the precursor, to prevent the precursor vapor from depositing on such components. Typically, these intervening components are heated separately by line heaters, cartridge heaters, heat lamps, and the like. Some systems (e.g., U.S. Published Patent Application No. 2005/0000428A1) utilize these additional heaters to bias the intervening components to a temperature above that of the source vessel. Such temperature biasing helps to prevent precursor condensation in the intervening components during cool-down. Since the source vessel typically has a higher thermal mass than the intervening gas-conveying components, these components are at risk of cooling down to the condensation temperature faster than the source vessel. This can lead to an undesirable condition in which the source vessel is still producing precursor vapor that can flow to the cooler intervening components and deposit thereon. The temperature biasing can overcome this problem. However, the need for additional heaters increases the total size and operating cost of the apparatus.

Further, conventional solid source delivery systems typically employ filters (such as the purifier 28 of FIG. 1) between the source vessel outlet and the substrate reaction chamber, in order to prevent solid precursor particles (e.g., powder entrained in the carrier gas flow) from entering the reaction chamber. Such filters also add to the total size of the apparatus and can require additional heaters to prevent condensation therein. Also, such filters are typically downstream of the source vessel outlet, which involves a risk that precursor particles may deposit on gas-conveying components downstream of the vessel outlet, such as within gas conduits or within the vessel outlet valve itself. These particles can damage components such as valves, which can compromise their ability to completely seal.

Figure 2:
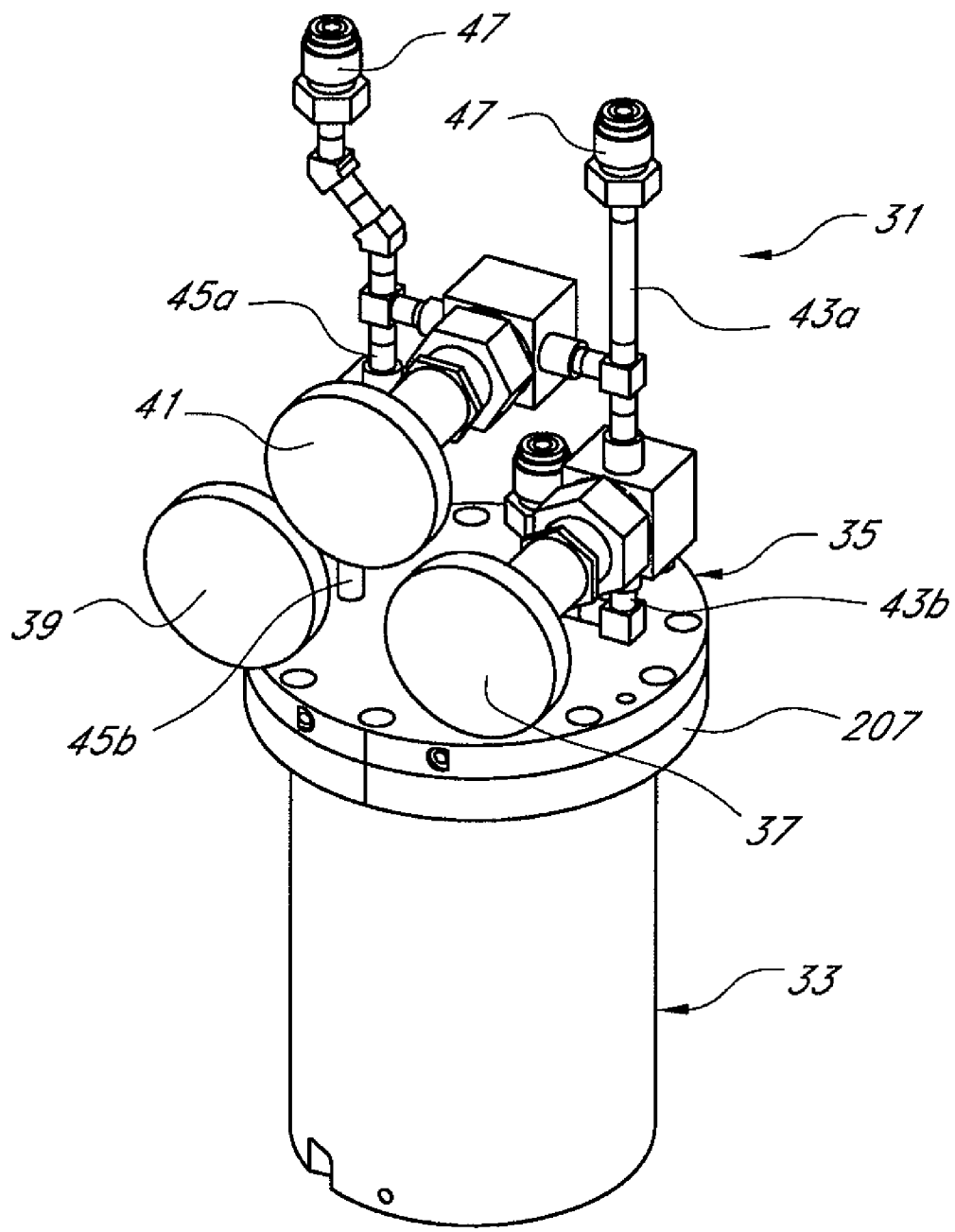
FIG. 2 is a perspective view of a conventional solid precursor source vessel.

Another drawback of conventional solid or liquid source delivery systems is that it is often difficult to recharge or replace the precursor source vessel. FIG. 2 shows a typical precursor source vessel 31 comprising a container body 33 and a lid 35. The lid 35 includes inlet tubes 43a, 43b and outlet tubes 45a, 45b extending upward therefrom. An isolation valve 37 is interposed between the inlet tubes 43a, 43b, and an isolation valve 39 is interposed between the outlet tubes 45a, 45b. Another isolation valve 41 is interposed between gas lines connecting the tubes 43a and 45a. The inlet tubes 43a, 43b and outlet tubes 45a, 45b provide for the flow of an inert carrier gas through the container body 33. The tubes 43a, 45a typically include fittings 47 configured to connect to other gas flow lines of the reactant gas delivery system. When the solid or liquid source precursor is depleted and in need of replacement, it is customary to replace the entire source vessel 31 with a new one that has a full load of the source chemical. Replacing the source vessel 31 requires shutting off the isolation valves 37 and 39, disconnecting the fittings 47 from the remaining substrate processing apparatus, physically removing the vessel 31, placing a new vessel 31 in the appropriate location, and connecting the fittings 47 of the new vessel 31 to the remaining substrate processing apparatus. Often, this process also involves disassembling various thermocouples, line heaters, clamps, and the like. These processes can be somewhat laborious.

Another drawback of conventional solid or liquid source delivery systems is that the gas delivery system can produce areas of stagnant flow (also referred to as "dead legs"). Dead legs tend to occur when the gas flow path from the precursor source vessel is longer and more complex. Conventional inlet and outlet isolation valves for the source vessel (as described above) can produce dead legs. In general, dead legs increase the risk of unwanted precursor deposition on the gas-conveying components of the delivery system. Such unwanted precursor deposition can occur due to cold spots associated with the dead volumes, wherein the precursor solidifies at temperatures below the sublimation/melting temperature. Such unwanted precursor deposition can also occur due to hot spots associated with the dead volumes, wherein the precursor decomposes at high temperatures. For this reason, it is generally desirable to reduce and minimize stagnation of the reactant gas flow. It is also generally desirable to reduce the surface area to be temperature-controlled, in order to lessen the chance of producing hot or cold spots.

Another reason to minimize the amount and volume of dead legs is to reduce the total volume of the gas delivery system interposed between the precursor source vessel and the substrate reaction chamber. As the total volume of the gas delivery system increases, often times the minimum pulse time and minimum purge time associated with ALD processing increase as well. The minimum pulse time is the pulse time necessary for an injected reactant to saturate the surface of a substrate being processed. The minimum purge time is the time necessary to purge excess reactant from the substrate reaction chamber and gas delivery system between reactant pulses. Substrate throughput (the rate at which substrates can be processed) is increased when the minimum pulse time and minimum purge time are decreased. Accordingly, it is desirable to reduce the amount and volume of dead legs in order to increase throughput.

Figure 3:
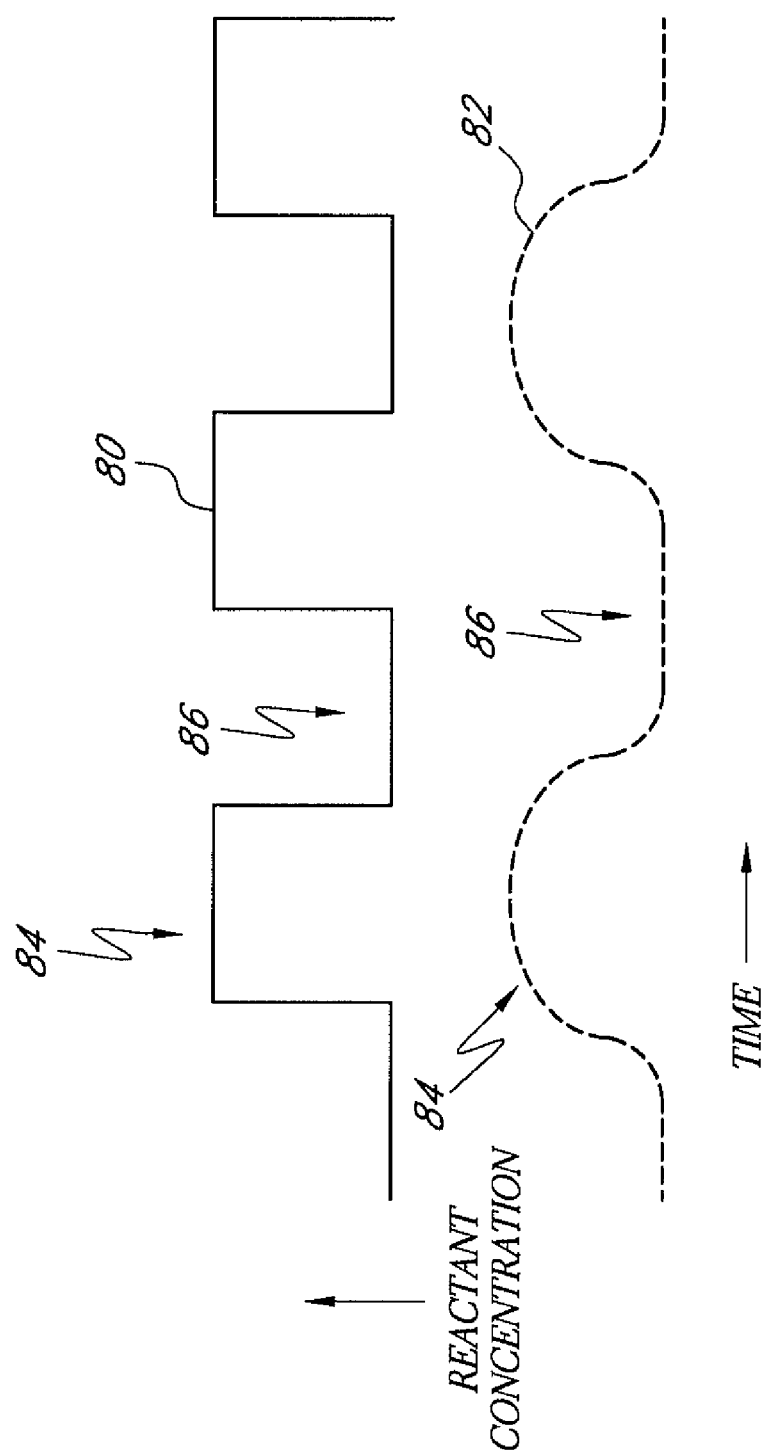
FIG. 3 is an illustration of both ideal and less than ideal source chemical concentrations in reactant gas pulses for atomic layer deposition.

Another benefit of reducing the total volume of the gas delivery system is to improve the "pulse shape" of the reactant gas pulses. The pulse shape refers to the shape of a curve of the reactant's chemical concentration in the reactant/carrier mixture, for a reactant gas pulse. FIG. 3 shows an example of an ideal reactant concentration curve 80, as well as a curve 82 that is less than ideal. Both curves include reactant gas pulses 84 separated by time periods 86 of substantially zero reactant concentration. The ideal curve 80 resembles a rectilinear wave, such as a square wave. A substantially rectilinear wave is preferred because it is highly desirable for each reactant gas pulse to deliver the reactant species to all of the available reaction sites on the substrate surface (saturation) in the least amount of time, in order to optimize substrate throughput. A rectilinear pulse shape, as in the curve 80, optimizes throughput because the duration of each pulse has a high concentration of the reactant, which in turn reduces the pulse duration necessary to deliver sufficient reactant species to the substrate surface. Also, the reduced dispersion of a rectilinear pulse shape reduces the amount of "pulse overlap" between successive pulses of different precursors, which reduces the potential for unwanted CVD growth modes. In contrast, the pulse concentration of each pulse 84 of the non-ideal curve 82 takes longer to reach its maximum level, which increases the pulse duration necessary to fully saturate the substrate surface. Thus, the frequency of the curve 80 is less than that of the curve 82. As the total volume of the gas delivery system increases, the pulse shape deteriorates. Accordingly, it is desirable to improve the pulse shape (i.e., make it more like a square wave) by minimizing dead legs.

Another drawback of conventional solid source delivery systems is the risk of contamination involved in venting the precursor source vessel prior to processing. Precursor source vessels are typically supplied with a head pressure of gas in the vessel. For example, a source vessel filled with precursor powder is often shipped with helium or other inert gas at a pressure slightly higher (e.g., 5 psi) than ambient pressure. Helium is typically used to enable an "out-bound" helium leak test using a helium leak detector to ensure vessel integrity just prior to shipment. This helium is often left or replaced with $N_2$ or other inert gas so that if a small leak is present, the gas leaks outward from the vessel, preventing atmospheric contamination of the precursor within the vessel. Before the vessel is used in substrate processing, the head pressure of internal gas is ordinarily removed. Typically, the vessel's internal gas is vented out through the vessel's outlet isolation valve, through the reactant gas delivery system, and ultimately through the reactor's exhaust/scrubber. In some systems, the vessel's internal gas is vented out through the substrate reaction chamber. Other systems employ a gas line in parallel with the reaction chamber (i.e., extending from a point just upstream of the reaction chamber to a point just downstream of the reaction chamber), such that the vessel's internal gas can be directed to the exhaust/scrubber without flowing through the reaction chamber. In either case, current vessel designs involve a risk of particle generation when the vessel is relieved of the head pressure. This can result in precursor powder becoming entrained within the vent flow (i.e., the venting out of the internal pressurized gas of the vessel), which can contaminate and possibly damage downstream components of the gas delivery system, including the vessel outlet itself. Even during normal processing, precursor material (e.g., powder) can become entrained within the carrier gas flowing through the precursor source vessel, which involves a risk of unwanted deposition of the precursor within the gas delivery system.

The presently disclosed embodiments of precursor delivery systems substantially overcome these problems by employing an improved precursor source vessel and apparatus for quickly connecting and disconnecting the vessel from the rest of the delivery system. These aspects are now described.

Gas Panel in Close Thermal Contact with Source Vessel

Figures 4, 5, 6:
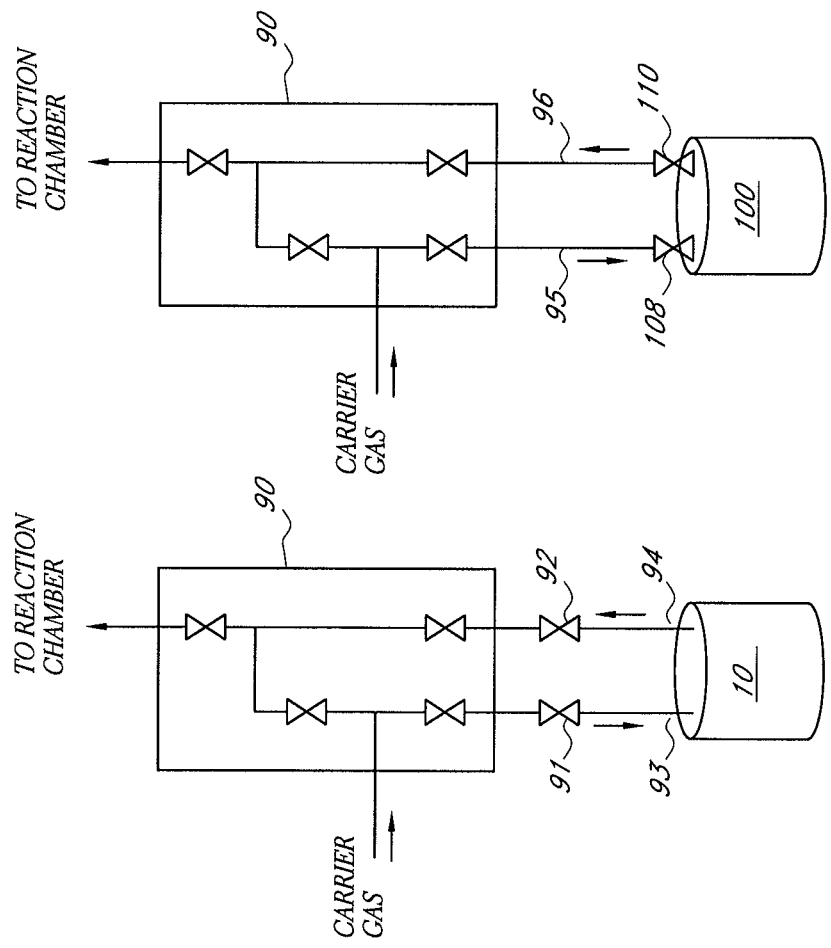
FIG. 4 is a schematic illustration of a conventional precursor source vessel and gas panel.
FIG. 5 is a schematic illustration of a precursor source vessel with surface-mounted valves and a gas panel.
FIG. 6 is a schematic illustration of a precursor source vessel with surface-mounted valves and a gas panel in close thermal contact with the vessel.

FIGS. 4-6 illustrate three different gas panel arrangements. A gas panel typically includes one or more valves that are downstream of a precursor source vessel, and can also include one or more valves upstream of the vessel. FIG. 4 illustrates a conventional arrangement in which a source chemical is contained within a source vessel 10. A gas panel 90 includes a plurality of valves operable to deliver carrier gas from a carrier gas source (not shown) through the vessel 10 and into a reaction chamber (not shown). An inlet valve 91 is connected upstream of the vessel 10 by tubing 93, and an outlet valve 92 is connected downstream of the vessel 10 by tubing 94. In this conventional arrangement, the inlet valve 91, the outlet valve 92, and the valves and tubing of the gas panel 90 are typically not in close thermal contact with the vessel 10.

FIG. 5 illustrates an arrangement that is somewhat improved relative to that of FIG. 4. In the arrangement of FIG. 5, a precursor source vessel 100 has a surface-mounted inlet valve 108 and a surface-mounted outlet valve 110. The valves 108 and 110 are separated from a conventional gas panel 90 by tubing 95 and 96. In this arrangement, the valves 108 and 110 are in close thermal contact with the vessel 100, but the valves and tubing of the gas panel 90 are not.

FIG. 6 illustrates an arrangement that is improved relative to that of FIG. 5. In the arrangement of FIG. 6, the source vessel 100 has a generally flat upper surface with a surface-mounted inlet valve 108 and a surface-mounted outlet valve 110. Also, a gas panel 97 is arranged such that the valves and tubing of the gas panel are positioned along a plane that is generally parallel to the generally flat surface of the vessel 100. In order to increase thermal contact between the vessel 100 and the gas panel valves and tubing, the distance between the plane of the gas panel valves and tubing and the generally flat surface of the vessel 100 is preferably no more than about 10.0 cm, more preferably no more than about 7.5 cm, and even more preferably no more than about 5.3 cm.

Source Vessel with Surface Mounted Valves and Serpentine Path

Figure 7:
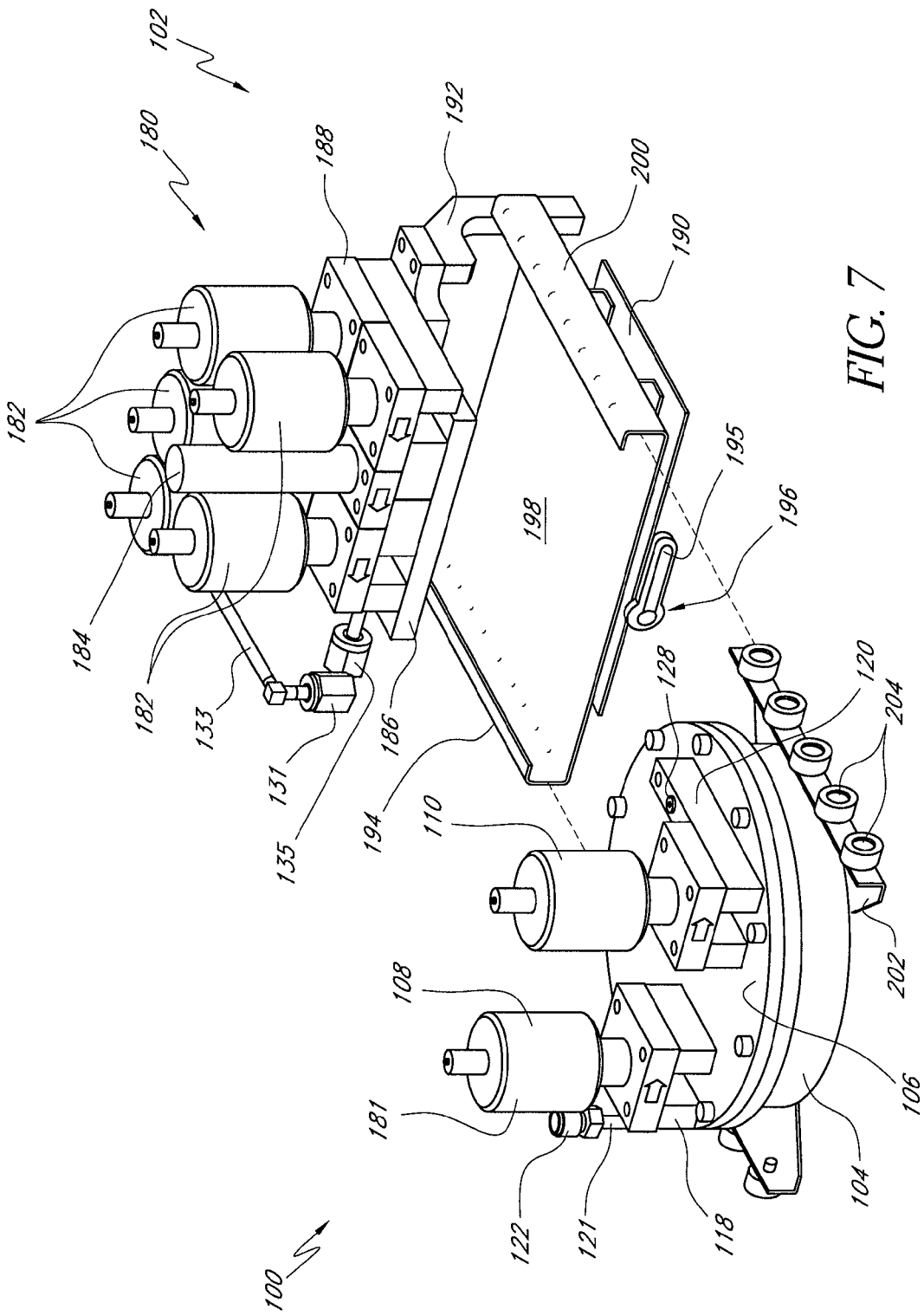
FIG. 7 is a perspective view of a preferred embodiment of a precursor source vessel, a gas interface assembly for fluidly communicating with the vessel, and a quick-connection assembly for connecting and disconnecting the vessel to the gas interface assembly.

FIG. 7 shows a preferred embodiment of an improved solid or liquid precursor source vessel 100 and a quick-connection assembly 102. The source vessel 100 includes a container body 104 and a lid 106. The lid 106 includes surface-mounted isolation valves 108 and 110, described in more detail below.

Figure 8:
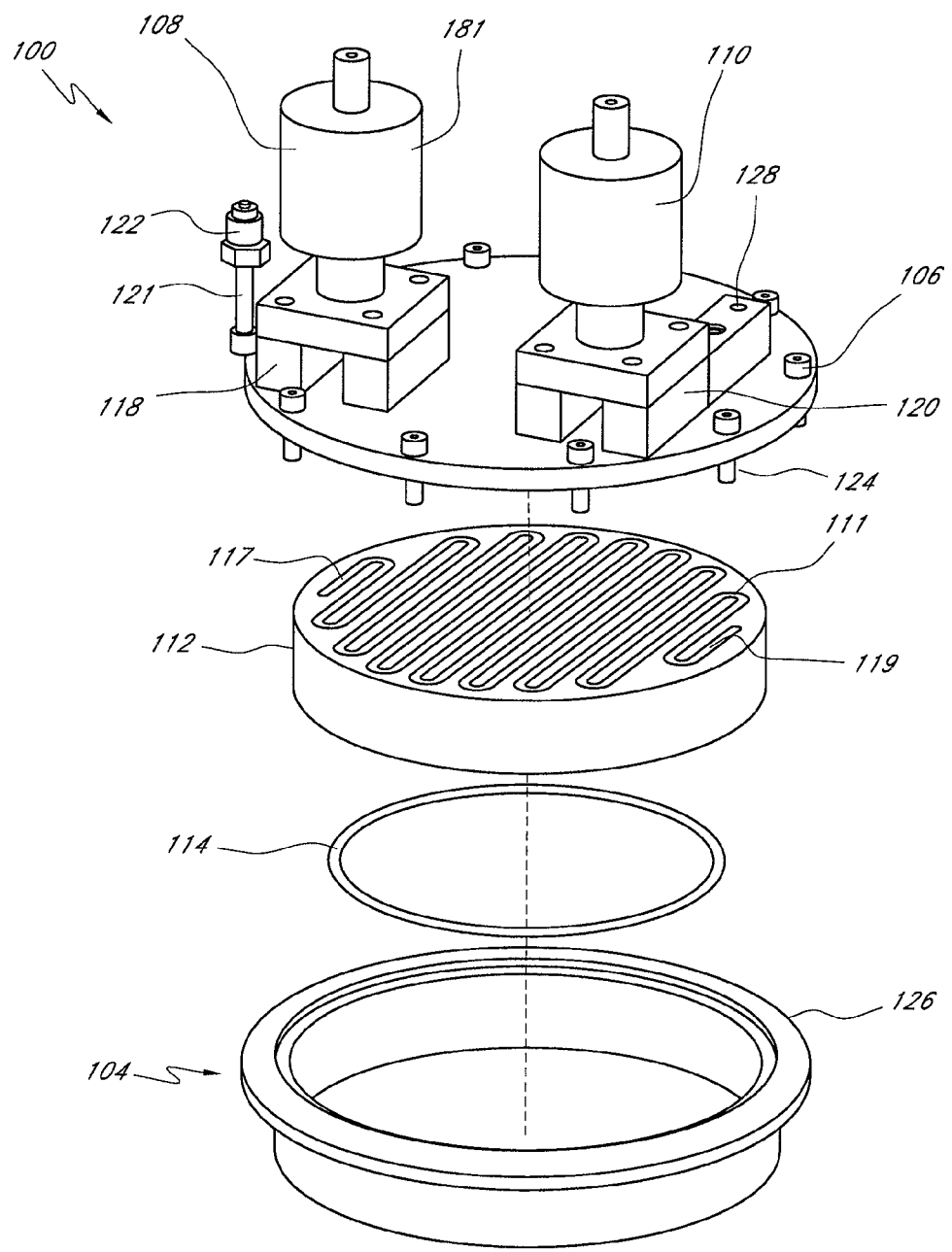
FIG. 8 is an exploded perspective view of the vessel of FIG. 7.
Figure 10:
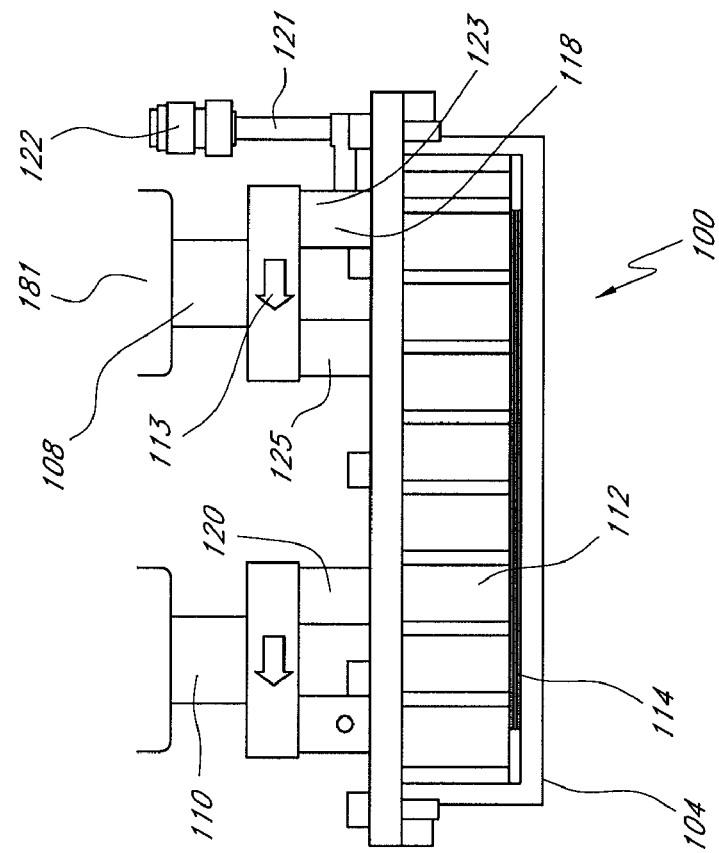
FIG. 10 is a rear sectional view of the vessel of FIG. 7.
Figure 9:
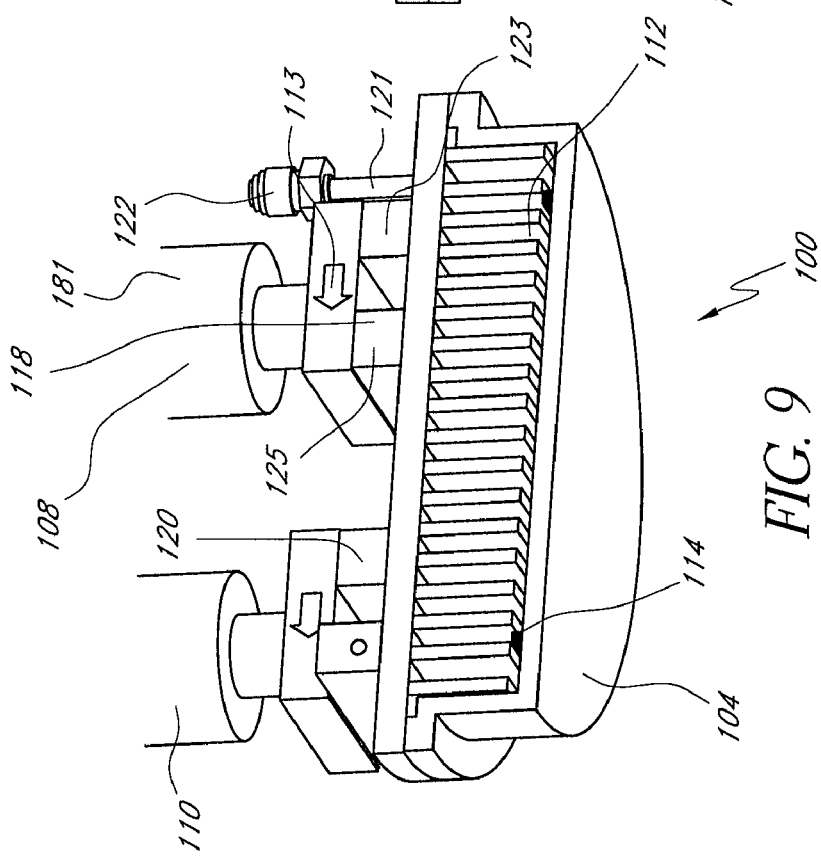
FIG. 9 is a rear perspective sectional view of the vessel of FIG. 7.

FIGS. 8-10 show the source vessel 100 of FIG. 7 in greater detail. FIG. 8 is an exploded view, and FIGS. 9 and 10 are rear cross-sectional views, of the source vessel 100. The illustrated vessel 100 includes the container body 104, a serpentine path insert 112 within the body 104, and the lid component 106. The illustrated assembly is fastened together by fastening elements 124, such as screws or nut and bolt combinations. The fastening elements 124 are adapted to extend into aligned holes within a flange 126 of the body 104. Skilled artisans will appreciate that the assembly can be fastened together by a variety of alternative methods.

The serpentine path insert 112 preferably defines a tortuous or serpentine path 111 through which a carrier gas must travel as it flows through the vessel 100. The serpentine path 112 preferably contains the precursor source, such as a powder or liquid. Causing the carrier gas to flow through a long serpentine path 111 while exposed to the precursor source causes the carrier gas to carry more reactant vapor. The serpentine path 111 is significantly longer than the carrier gas flow pathway within conventional precursor source vessels. Since the carrier gas is required to flow along a longer path while exposed to the precursor source, it is exposed to the precursor source for a longer time and is thus more likely to become saturated with the precursor. The serpentine path 111 also reduces the importance of heating up the vessel 100 during processing, because the carrier gas becomes exposed to more reactant chemical for a longer residence time, the practical effect being a reduction in the required temperature for sublimation/vaporization. The valves 108 and 110 (described below) and the valve 210 (described below with reference to FIGS. 25-28) are subjected to a less severe environment, thereby increasing their reliability. The reduced temperature requirement also increases the component options in the design. Performance is also improved because it is easier to deliver sufficient amounts of reactant vapor to the reaction chamber. Also, during ALD processing, the concentration of each reactant pulse becomes less time-variant. In other words, as the carrier gas approaches full saturation with the reactant vapor, the reactant pulse shape becomes closer to a rectilinear wave.

A spring 114 is preferably provided to bias the serpentine insert 112 against the lid 106, to prevent the escape of reactant gas through the interface between the insert 112 and the lid 106. In other words, the spring 114 tends to reduce the risk of the gas bypassing some or all of the serpentine path. Suitable springs 114 include flat wire compression springs, such as the Spirawave® wave springs sold by Smalley Steel Ring Company of Lake Zurich, Ill.

Figure 11:
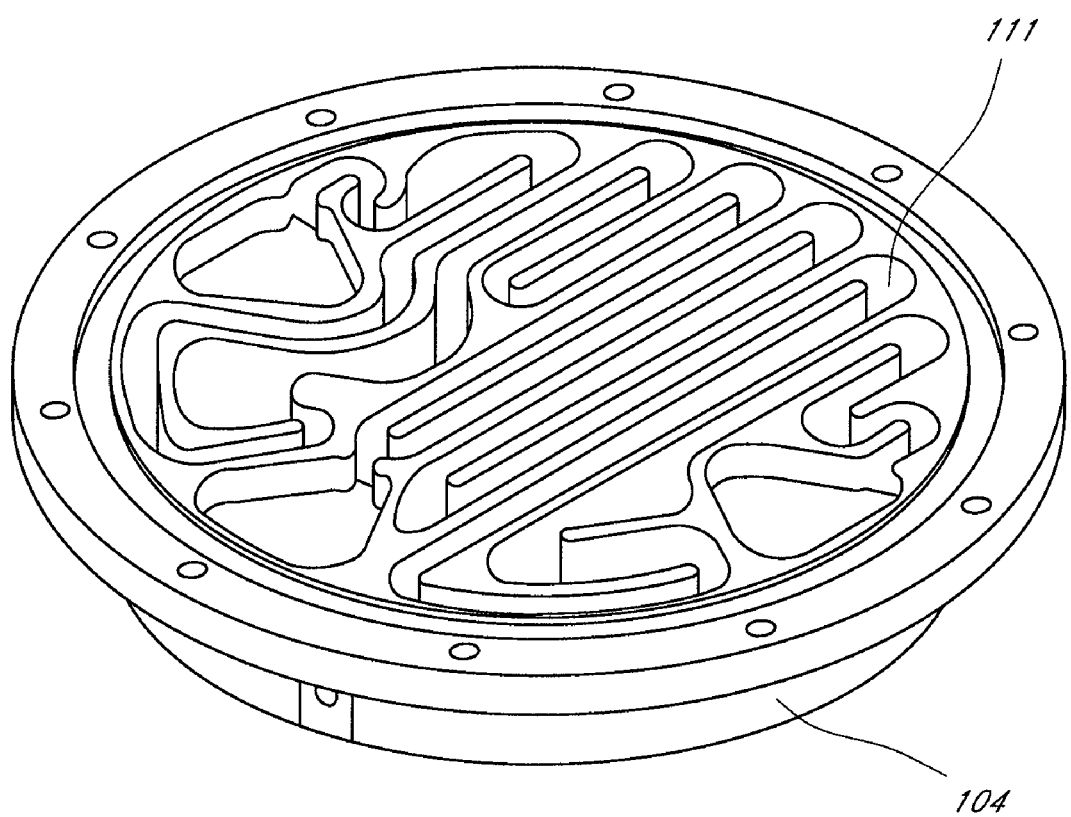
FIG. 11 is a top perspective view of an alternative embodiment of a vessel body.

In an alternative embodiment, the serpentine path 111 is machined directly into the container body 104 or vessel lid 106. For example, FIG. 11 shows a container body 104 having an integrally formed serpentine path 111 machined directly therein.

Figure 12:
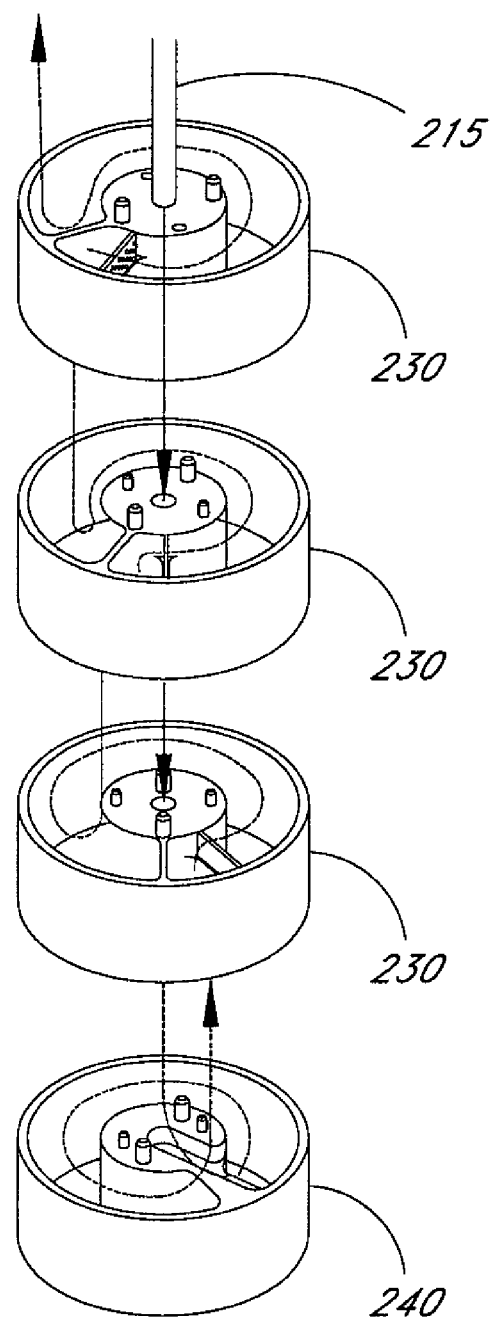
FIG. 12 is an exploded perspective view of an embodiment of a serpentine insert comprising a stack of trays.

In another alternative embodiment, illustrated in FIGS. 12-16, the serpentine insert 112 comprises a plurality of stacked trays that collectively define a serpentine gas flow path. For example, FIG. 12 shows a plurality of stacked trays 230, 240 that are configured to be removably inserted into a container body 104 (FIGS. 7-10) and that collectively define a spiral gas flow path that comprises at least a portion of the tortuous path of the vessel 100. In FIGS. 12-16, the heights of the trays 230, 240 are enhanced for ease of illustration. It should be understood that the trays can be made vertically thinner so that the vessel 100 has a diameter significantly greater than its overall height.

In the illustrated embodiment, four trays are stacked: three upper trays 230 and one lower tray 240. The number of trays can vary based on parameters such as the sublimation rate, carrier flow, etc.

Figure 13:
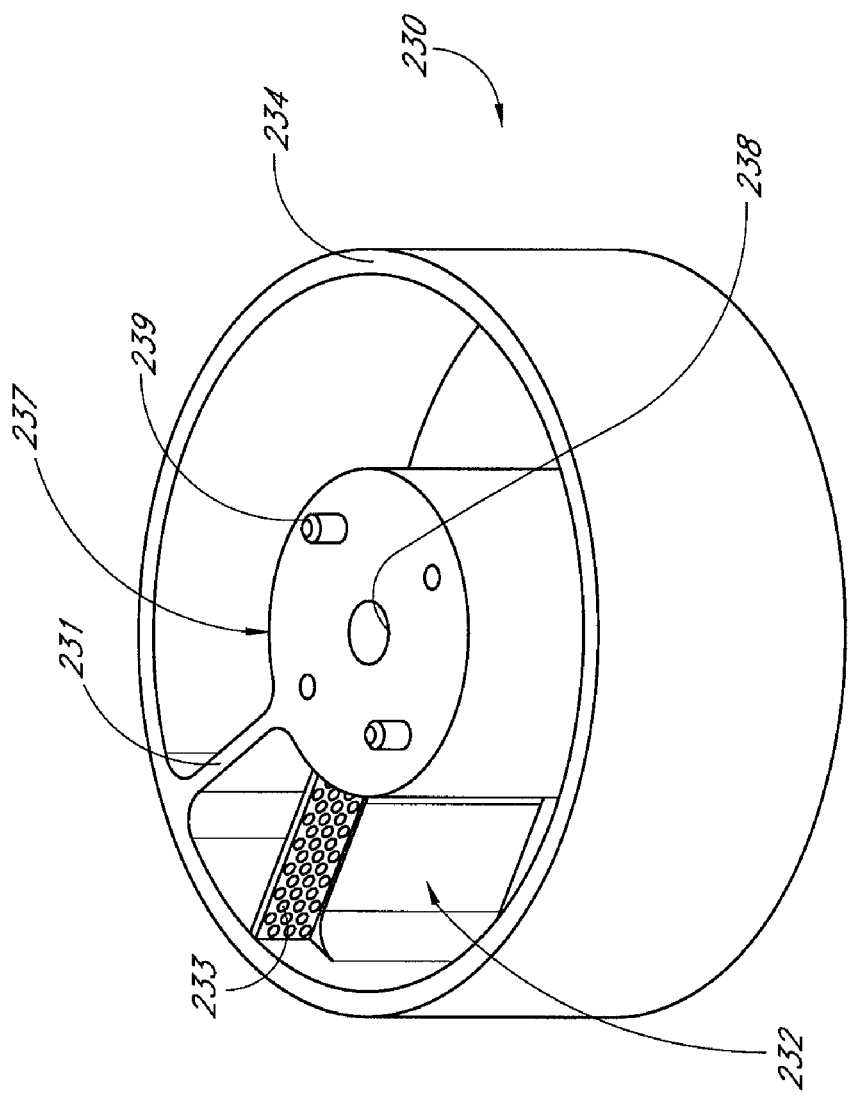
FIG. 13 is a perspective view of an upper stacking tray of the serpentine insert of FIG. 12.
Figure 14:
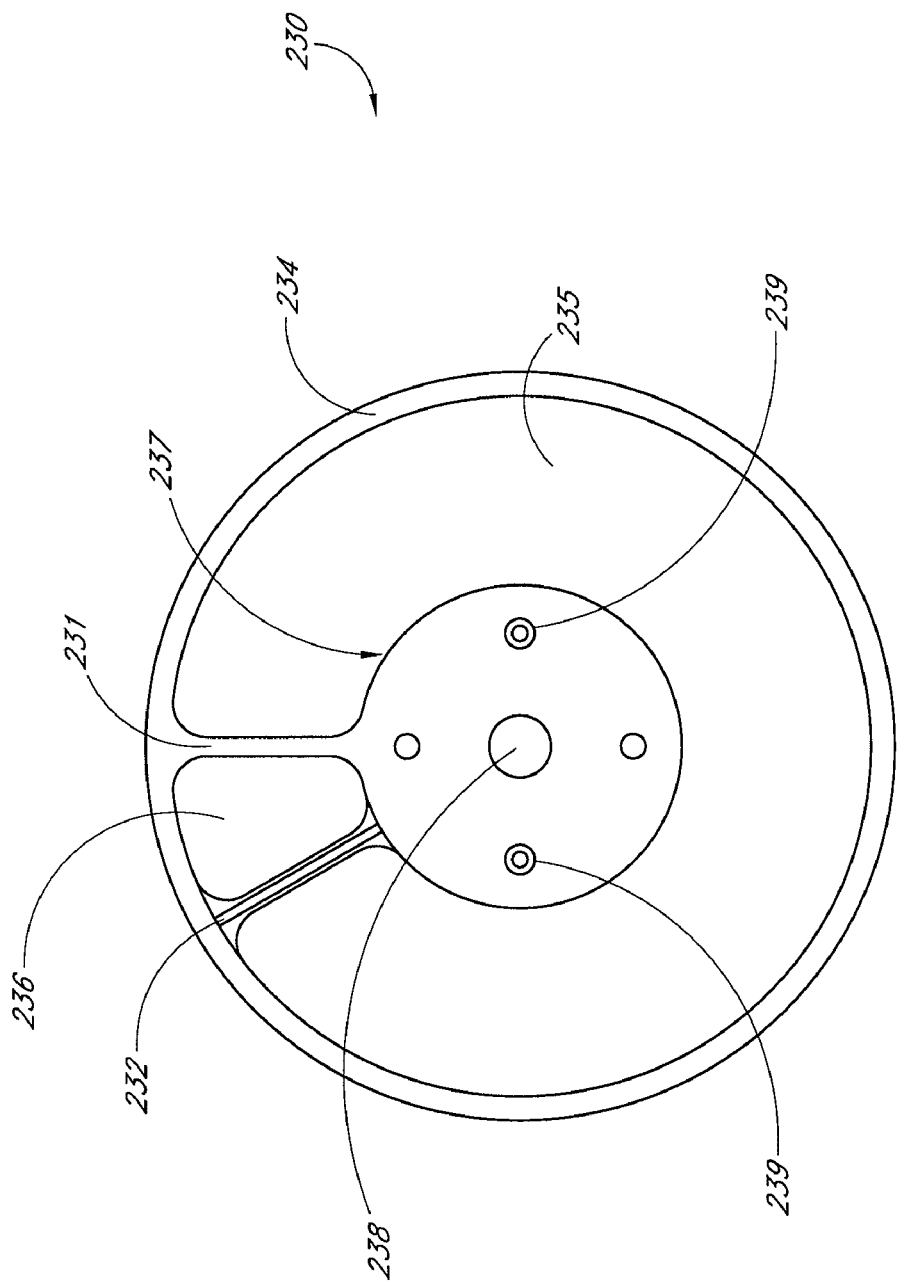
FIG. 14 is a top view of the upper stacking tray of FIG. 13.

Referring to FIGS. 13 and 14, each upper tray 230 includes a solid divider 231, preventing gas flow therethrough and extending the full height of the tray 230, and a partial divider 232 that allows gas flow therethrough. Preferably, the partial divider includes a screen 233 configured to retain large precursor particulates while allowing free gas flow therethrough. In the illustrated embodiment, the screen 233 extends across the top portion of the partial divider 232, while a solid panel completes the height of the partial divider 232. An annular rim 234 also extends the height of the upper tray 230. The solid divider 231 and the partial divider 232 together define a main compartment 235 for holding solid source material (not shown) and an outer channel compartment 236 that is open at the lower surface of the tray 230. The illustrated upper tray 230 has a central core 237 that includes a central channel 238 to accommodate a gas inlet pipe that delivers carrier gas to the bottom tray 240. The illustrated upper tray 230 also has a plurality of pegs 239 on an upper surface thereof and a corresponding plurality of holes (not shown) on a bottom surface thereof for receiving the pegs of another tray therebelow. As will be better understood in view of the operation, described hereinbelow, the holes on the lower surface of the central core 237 are desirably rotationally offset relative to the pegs 239 on the upper surface, serving to properly align the plurality of trays upon one another to define the winding flow path. In certain preferred embodiments, the corners in the main compartment to which the flow is exposed are rounded to minimize flow stagnation from sharply angled corners.

Figure 15:
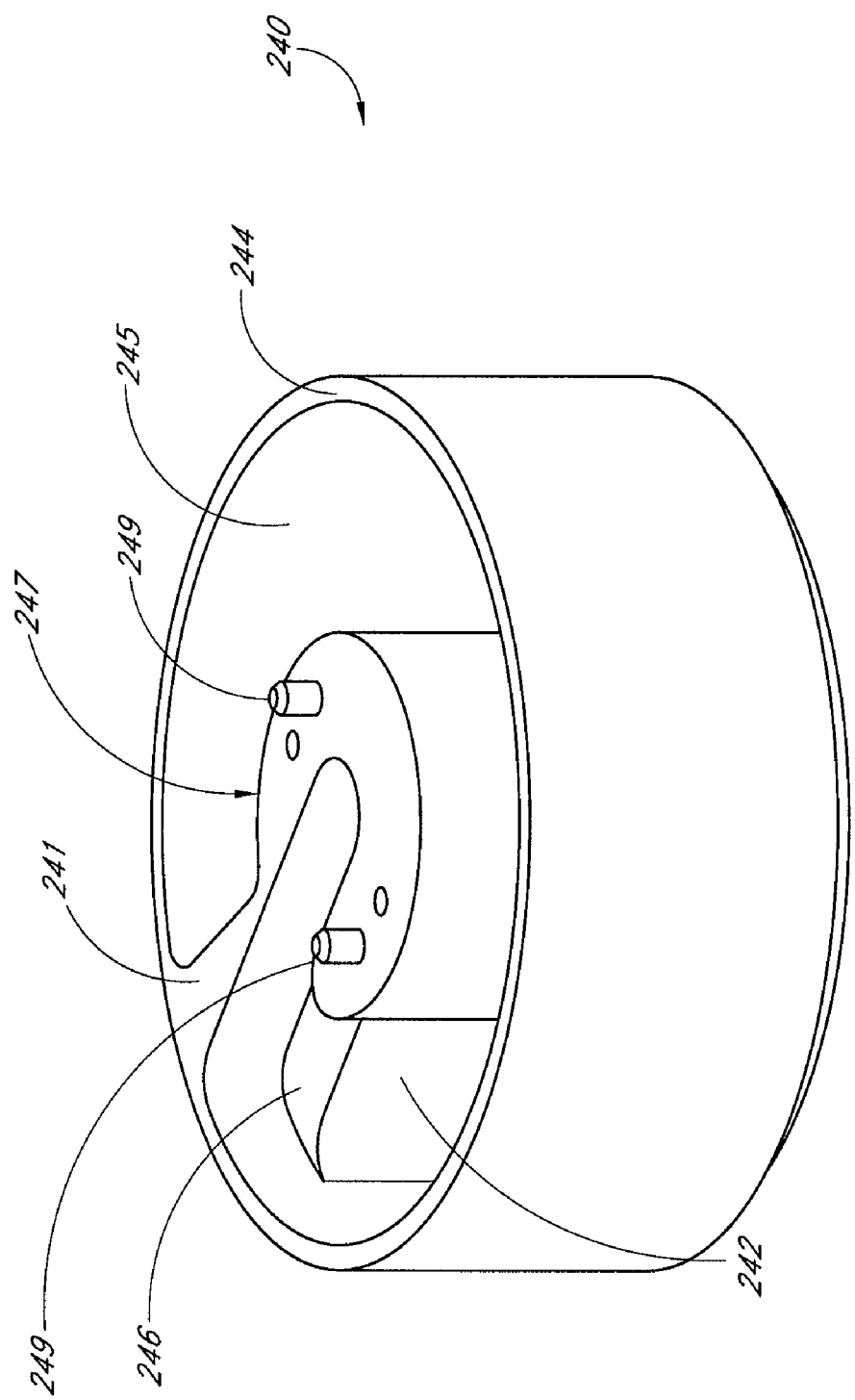
FIG. 15 is a perspective view of a lower stacking tray of the serpentine insert of FIG. 12.
Figure 16:
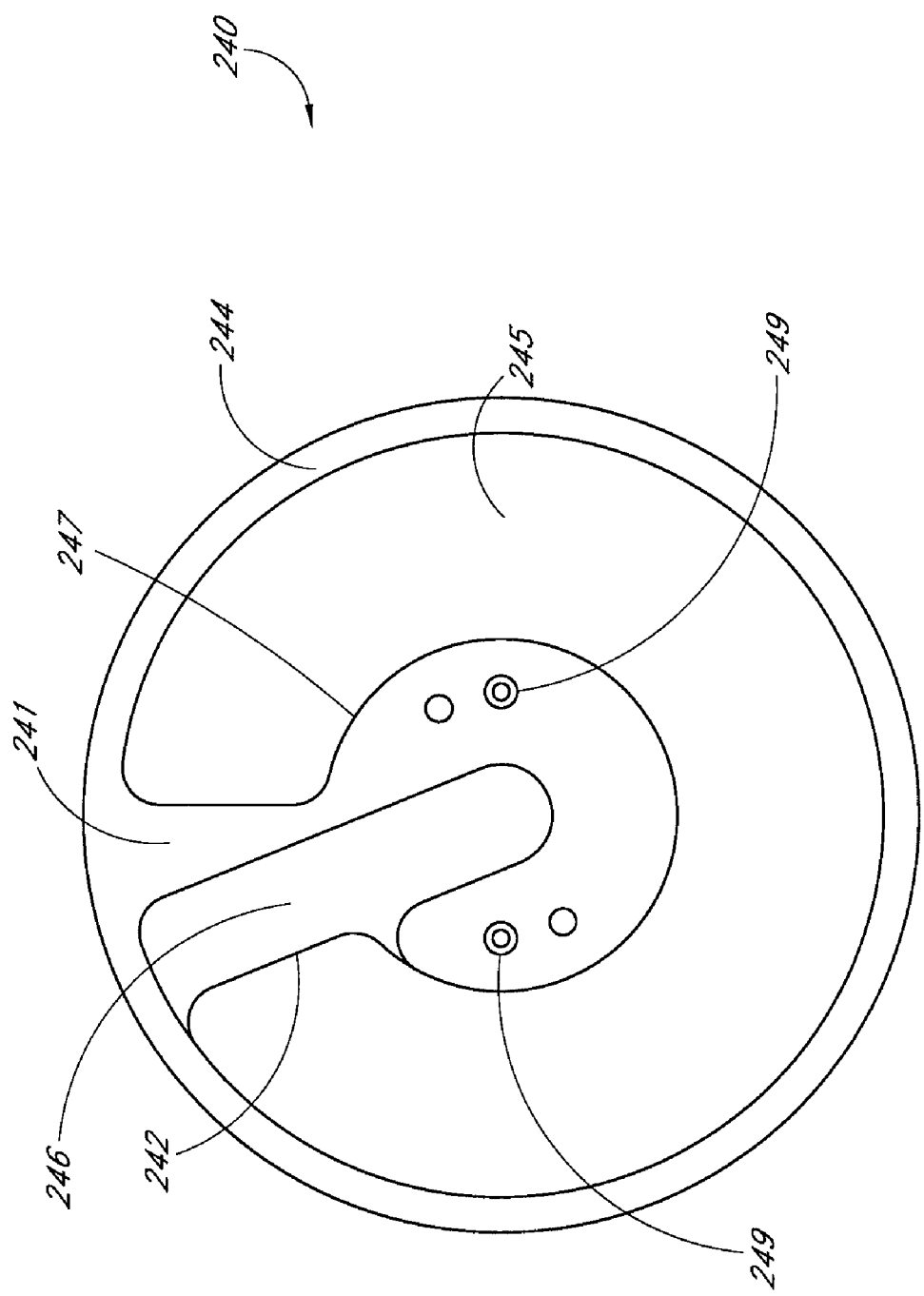
FIG. 16 is a top view of the lower stacking tray of FIG. 15.

Referring to FIGS. 15 and 16, the lowest tray 240 comprises a solid divider 241, preventing gas flow therethrough and extending the full height of the tray 240, and a partial divider 242 that allows gas flow thereover. Preferably, the partial divider 242 simply provides an opening to the central channel 238 in the middle of the overlying upper tray 230, as will be better understood in view of the description of FIG. 12. An annular rim 244 also extends the height of the lower tray 240. The rim 244, the solid divider 241 and the partial divider 242 together define a main compartment 245 for holding solid source material (not shown) and an outer channel compartment 246. In preferred embodiments, the solid source material only fills the main compartment 245 up to and even with channel compartment 246. In alternate embodiments, the solid source material fills the between one third and two thirds of the height of the main compartment. The illustrated lower tray 240 also has a central core 247 into which the channel compartment 246 protrudes, a plurality of pegs 249 on an upper surface thereof and a corresponding plurality of holes (not shown) on a bottom surface thereof for receiving pegs that protrude upwardly from a floor of the container body 104 (FIGS. 7-10).

The stack of trays 230, 240 is assembled as shown in the exploded view of FIG. 12. The main compartments 235, 245 for each of the upper trays 230 and the lower tray 240 are loaded with a precursor source chemical, preferably in the form of powder. The lower tray 240 and plurality of upper trays 230 are stacked upon one another and loaded into the external container body 104. The trays 230, 240 are aligned by the pegs 239, 249 and corresponding holes such that gas flows into each tray, preferably at least flowing a lap of within 200°-355° around the main compartment and then up into the channel compartment 236 of the overlying upper tray 230. The container lid 106 (FIGS. 7 and 8) is then closed and sealed over the container body 104, and a central pipe 215 extending from the lid extends down through the central channels 238 of the upper trays 230 to open into the channel compartment 246 of the lower tray 240. FIG. 12 shows the central pipe 215 but not the lid 106. The central pipe 215 is configured to deliver carrier gas conveyed into an inlet of the vessel 100. In certain preferred embodiments, a spring or other biasing device (not shown) is often placed below 240 to bias all the trays together, preventing leaks from the central core to a different level.

In operation, inert gas is preferably delivered to the stack of trays 230, 240, and experiences a long and winding flow route horizontally, preferably through an arc of about 200°-350° of the main compartment in each tray 230, 240 before vertically exiting that tray. In the illustrated embodiment, inert carrier gas is provided through a central inlet 215 that extends down through the aligned central channels 238 of the upper trays 230 to open into the channel compartment 246 of the lower tray 240. The inert gas winds through the precursor source chemical in the main compartment 245 until encountering an opening in the lower surface of the overlying upper tray 230. This opening allows the carrier gas, and the vaporized precursor it carries with it, to pass into the channel compartment 236 of the overlying upper tray 230, from which the gas passes through the screen 233 (FIG. 13) and into the main compartment 235. The gas winds through solid precursor in that main compartment 235, preferably through an arc of about 200°-350° before encountering an opening in the lower surface of the overlying upper tray 230, etc. At the uppermost upper tray 230, the gas is allowed to exit the vessel 100, preferably through a surface-mounted outlet valve 110 (described below) at the lid vessel 106. It will be understood, of course, that the flow path can be reversed if desired. In other words, the inert carrier gas can begin in a top tray and flow downward through the stack of trays.

Referring again to FIGS. 8-10, in the illustrated embodiment the vessel lid 106 includes an inlet valve 108 and an outlet valve 110. The inlet valve 108 has an inlet end that receives carrier gas via a conduit 121. The conduit 121 has a fitting 122 adapted for connection to a fitting 131 (FIG. 7) of a gas line 133 of a gas interface assembly 180 (described below). The inlet valve 108 also has an outlet end that is preferably in fluid communication with a first portion 117 (such as an end portion) of the serpentine path 111 of the insert 112. The outlet valve 110 has an inlet end that is preferably in fluid communication with a second portion 119 (such as an end portion) of the serpentine path 111, and an outlet end in fluid communication with a suitable gas outlet of the lid 106, such as an orifice 128. In use, carrier gas flows into the conduit 121 and through the inlet valve 108, serpentine path 111, and outlet valve 110 before exiting from the orifice 128. Thus, results that may be achieved by this embodiment include mounting the isolation valves onto the surface of the lid 106, and causing the carrier gas to flow along a tortuous or serpentine path while it is exposed to the precursor source. Skilled artisans will appreciate that the vessel 100 can be configured differently.

As explained above, conventional solid or liquid precursor source vessels include discrete tubes that extend from the vessel body or lid, with the valves being attached inline with such tubes. For example, the conventional vessel 31 of FIG. 2 includes discrete tubes 43b and 45b extending upward from the lid 35, with the valves 37 and 39 being attached to such tubes. The valves 37 and 39 of the vessel 37 are not directly attached to or in contact with the lid 35. As a result, the reactant gas from the vessel 31 flows out of the outlet tube 45b and then into the outlet valve 39, which may involve a flow path with stagnant or dead gas volumes. In addition, the isolation valves 37, 39, and 41 of the conventional vessel 31 are significantly thermally isolated from the vessel lid 35 and body 33. Both the tubing and the valves are very difficult to effectively heat with three-dimensional geometry, regardless of the presence or absence of dead volumes or "dead legs." The valves have a smaller thermal mass than the lid 35 and body 33 and therefore tend to heat up and cool down faster. That is why, in conventional systems, additional heaters (such as line heaters, cartridge heaters, directed heat lamps, etc.) are often used specifically to provide heat to the valves and associated tubing during system cool-down, to prevent such components from cooling down faster than the vessel 31 (which can create an unwanted condition in which reactant vapors flow into such components and deposit thereon). Another problem with the conventional valves and tubing is that they can heat up faster than the vessel 31. For some precursors, this can create a condition in which the valves and tubing become warmer than the decomposition temperature of the precursor, causing the precursor to decompose and deposit thereon.

In contrast, the isolation valves 108 and 110 (FIGS. 7-10) of the source vessel 100 are preferably mounted directly to the surface of the lid 106 of the vessel 100. Such surface mount technology may be referred to as an integrated gas system. In comparison to conventional precursor source vessels (e.g., FIG. 2), the surface-mounted valves 108 and 110 can reduce the volume of dead legs (stagnant reactant gas flow) in the gas delivery system by eliminating tubing between the valves and the vessel 100, which simplifies and shortens the travel path of the reactant gas. The valves and tubing are much more amenable to heating due to the compressed geometry and improved thermal contact, which lessens temperature gradients. The illustrated surface-mounted valves 108 and 110 have valve porting blocks 118 and 120, respectively, which preferably include valve seats and adjustable flow restrictors (e.g., diaphragms) for selectively controlling gas flow through the valve seats. Such valves 108 and 110 isolate the vessel 100 by restricting all gas flow through the valve seats. The porting blocks 118, 120 can be formed integrally with the vessel lid 106 or can be separately formed and mounted thereon. In either case, the porting blocks 118, 120 preferably have a relatively high degree of thermal contact with the vessel lid 106. This causes the temperatures of the valves 108 and 110 to remain close to that of the lid 106 and container body 104 during temperature changes of the vessel 100. This surface-mounted valve configuration can reduce the total number of heaters required to prevent condensation of vaporized precursor gas. When the vessel 100 is above the vaporization temperature of the precursor source chemical, vaporized precursor can freely flow to the valves 108 and 110. Since the valves 108, 110 closely track the temperature of the vessel 100 during temperature ramping, the valves are also likely to be above the vaporization temperature, thus reducing the need for additional heaters to prevent condensation of the precursor in the valves. The shortened gas flow paths are also better suited for controlled heating. The surface-mounted valves 108 and 110 also have a much smaller packaging space requirement.

Each of the valves 108 and 110 preferably comprises a valve porting block including gas flow passages that can be restricted or opened by the valve. For example, with reference to FIGS. 9 and 10, the porting block 118 of valve 108 preferably includes an internal gas flow passage extending from the conduit 121 through one side 123 of the porting block 118 to a region 113. The region 113 preferably includes an internal apparatus (not shown) for restricting the flow of the gas, such as a valve seat and a movable restrictor or diaphragm. In one embodiment, the movable internal restrictor or diaphragm can be moved by turning a knob (e.g., the larger cylindrical upper portion 181 of the valve 108) either manually or in an automated fashion. Another internal gas flow passage preferably extends from the region 113 through an opposite side 125 of the block 118 to an inlet passage that extends through the lid 106 into the vessel 100. For example, the inlet passage can extend into the tortuous path 111 defined by the serpentine insert 112. The valve 110 and vent valve 210 (described below with reference to FIGS. 25-28) can be configured similarly to valve 108. In one embodiment, the valves 108 and 110 are pneumatic valves. It is particularly preferred to form the valve porting blocks 118 and 120 integrally with the vessel lid 106. This eliminates the need for separate seals therebetween.

In another embodiment, the valves 108, 110, and 210 (FIGS. 25-28) are formed without porting blocks, such as porting blocks 118, 120, and are preferably formed integrally with a portion of the vessel 100, such as the vessel lid 106.

Filter

Preferably, the precursor source vessel includes a filtration apparatus for filtering the gas flow through the vessel, to prevent particulate matter (e.g., the source chemical's powder) from escaping the vessel. The filtration apparatus can be provided in a lid of the vessel, preferably underneath a surface-mounted valve 108, 110, and/or 210 (FIGS. 25-28). Preferably, the filtration apparatus comprises a separate filter for each inlet and outlet of the vessel.

Figure 17:
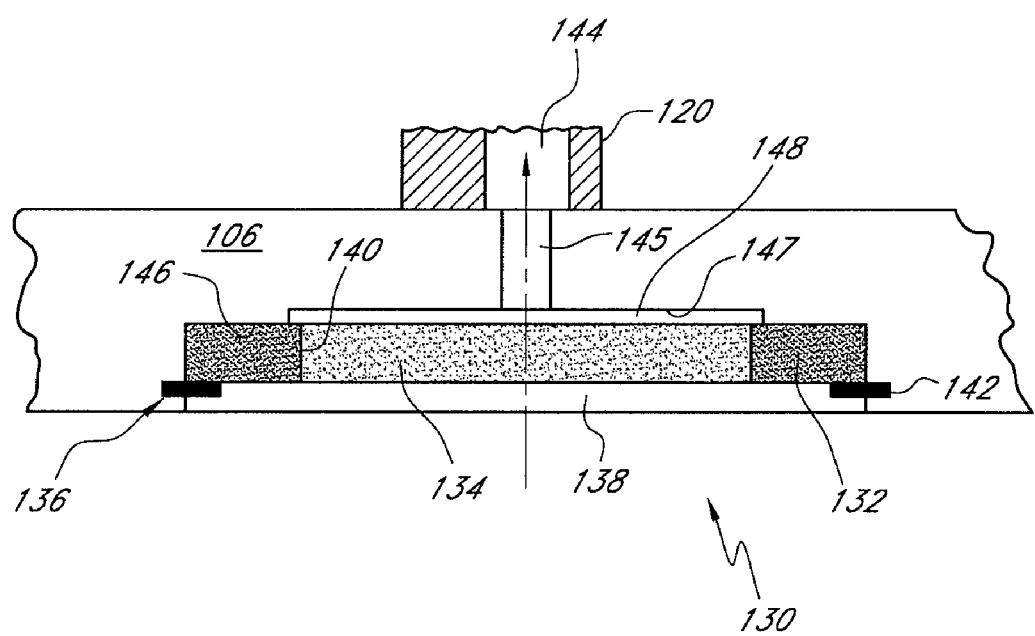
FIG. 17 is a sectional view of a filter mounted on a lid of a precursor source vessel.

FIG. 17 is a sectional view of one embodiment of a filtration apparatus 130, which can be installed in the body or lid (e.g., lid 106 of FIG. 8) of a reactant source vessel. The illustrated apparatus 130 is a filter formed of a flange 132, a filter media 134, and a fastener element 136. In this embodiment, the filter 130 is sized and shaped to fit closely into a recess 138 of the vessel's lid (e.g., lid 106 of FIG. 8). The perimeter of the flange 132 can be circular, rectangular, or other shapes, and the shape preferably conforms tightly to the perimeter of the recess 138. The filter material 134 is configured to restrict the passage of gas-entrained particles greater than a certain size through an opening defined by an annular inner wall 140 of the flange 132. The material 134 preferably blocks the entire opening defined by the wall 140. The material 134 can comprise any of a variety of different materials, and in one embodiment is a high flow sintered nickel fiber media. In other embodiments, the filter media is manufactured from other metals (e.g., stainless steel), ceramics (e.g., alumina), quartz, or other materials typically incorporated in gas or liquid filters. The material 134 is preferably welded or adhered to the annular wall 140. In one embodiment, the filter 130 comprises a surface-mount sandwich filter, such as those sold by TEM Products of Santa Clara, Calif.

In the illustrated embodiment, the fastener element 136 comprises a spring snap ring that biases the flange 132 against a wall 146 of the lid 106. The ring 136 preferably fits closely within an annular recess 142 in the perimeter of the recess 138. The snap ring 136 can comprise, for example, a flat wire compression spring, such as the Spirawave® wave springs sold by Smalley Steel Ring Company of Lake Zurich, Ill. Additional and different types of fastener elements can be provided to fasten the filter 130 to the lid 106. Preferably, the fastener element 136 prevents the flow of carrier gas and reactant vapor through the interface between the flange 132 and the lid 106, such that all of the gas must flow through the filter material 134. A sub-recess 147 can be provided to define a plenum 148 on an outlet side of the filter 130, which can improve the quality of the filtered gas flow. The illustrated filter 130 is easily replaceable, simply by removing the snap ring 136 from the annular recess 142, removing the filter 130 from the recess 138, inserting a new filter 130, and reinserting the snap ring 136 into the annular recess 142.

The filter recess 138 is preferably located closely to one of the isolation valves of the precursor source vessel. In the embodiment of FIG. 17, the recess 138 is directly below the valve porting block 120 of the outlet isolation valve 110 (FIG. 1) of the source vessel 100. Skilled artisans will understand that individual filters 130 may be provided in association with each isolation valve of the vessel, including the inlet valve 108 and the vent valve 210 (FIGS. 25-28). A passage 145 extends from the plenum 148 to a passage 144 of the valve porting block 120. In the illustrated embodiment, the porting block 120 is formed separately from the vessel lid 106, and a seal is preferably provided therebetween. In another embodiment, the block 120 is formed integrally with the lid 106 and the passages 144 and 145 are formed in the same drilling operation.

Figure 18:
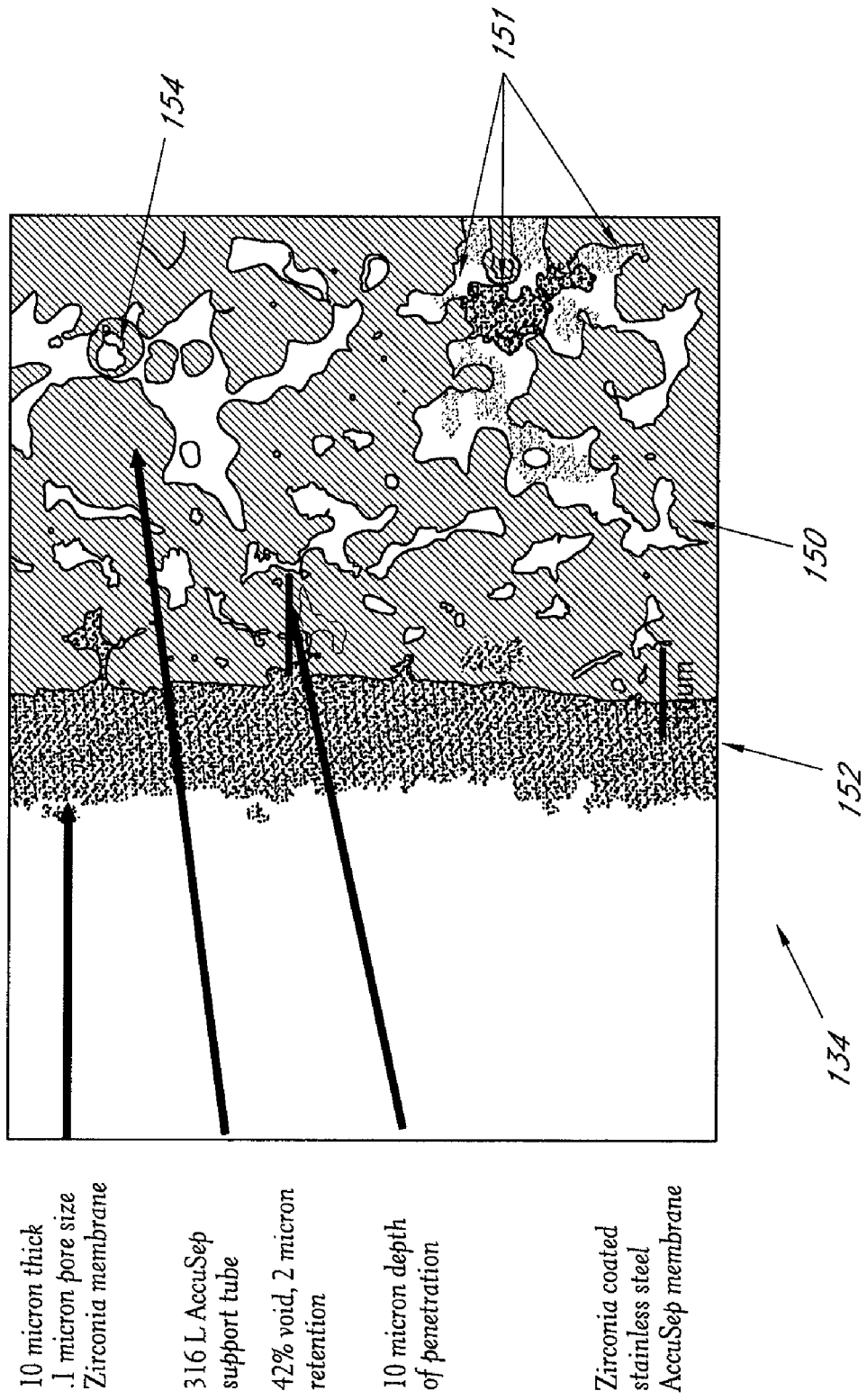
FIG. 18 is an embodiment of a filter material that can be used for the filter of FIG. 17.

FIG. 18 is a magnified sectional view a surface portion of a filter material 134 in accordance with one embodiment. In this embodiment, the filter material 134 includes a large particle filtration layer 150 and a small particle filtration layer 152. The large particle filtration layer 150 preferably filters relatively larger particles, and the small particle filtration layer 152 preferably filters relatively smaller particles. The large particle filtration layer 150 includes a plurality of voids 151. In one embodiment, the large particle filtration layer 150 is about 20-60% void, and more preferably 30-50% void. In one embodiment, the large particle filtration layer 150 is about 42% void. The large particle filtration layer 150 can comprise, for example, a stainless steel material. The large particle filtration layer 150 preferably comprises a majority of the filter material 134. Due to the voids 151, the filter material 134 produces a relatively low pressure drop. One or more support tubes 154 can be provided for enhanced structural rigidity of the large particle filtration layer 150. The small particle filtration layer 152 can have a pore size of 0.05-0.2 microns, and more preferably about 0.10 microns. The small particle filtration layer 152 can have a thickness of about 5-20 microns, and more preferably about 10 microns. The small particle filtration layer 152 may comprise, for example, a coating of Zirconia. Each side of the large particle filtration layer 150 can be coated with a small particle filtration layer 152. A suitable filter material is one that is similar to an AccuSep filter sold by Pall Corporation.

Gas Interface Assembly

Figure 19:
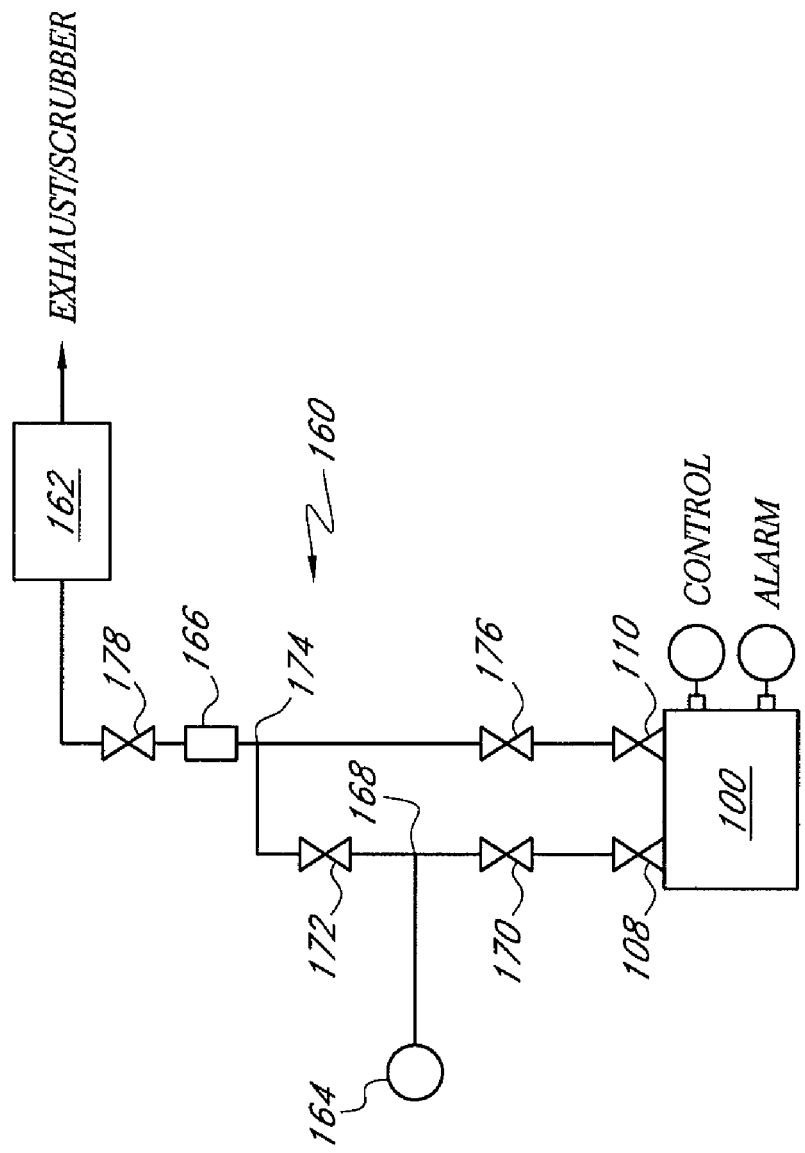
FIG. 19 is a schematic illustration of a gas delivery system for flowing carrier and reactant gases through a precursor source vessel and a vapor phase reaction chamber.

FIG. 19 is a schematic illustration of a gas delivery system 160 that can be used to flow carrier and reactant gases through the precursor source vessel 100 and a vapor phase reaction chamber 162. The delivery system 160 includes the vessel 100, a carrier gas source 164, a downstream purifier or filter 166, and several additional valves, as described herein. The isolation valves 108, 110 are preferably surface-mounted on the vessel 100 as described above. The carrier gas source 164 is operable to deliver an inert carrier gas to a connection point 168. A valve 170 is interposed between the connection point 168 and the vessel inlet valve 108. A valve 172 is interposed between the connection point 168 and a connection point 174. A valve 176 is interposed between the connection point 174 and the vessel outlet valve 110. The purifier 166 and an additional valve 178 are interposed between the connection point 174 and the reaction chamber 162. As illustrated, the vessel 100 can have appropriate control and alarm interfaces, displays, panels, or the like.

When it is desirable to flow the carrier gas through the vessel 100 and to the reaction chamber 162, the valves 170, 108, 110, 176, and 178 are opened and the valve 172 is closed. Conversely, when it is desirable for the carrier gas to bypass the vessel 100 on its way to the reaction chamber 162, the valves 172 and 178 are opened, and preferably all of the valves 170, 108, 110, and 176 are closed. The valve 178 can be used to isolate the reaction chamber 162 from the gas delivery system 160, e.g. for maintenance and repair.

With reference again to FIG. 7, a precursor gas delivery system (such as that shown in FIG. 19) can be embodied in a gas interface assembly 180 that facilitates control of the flow of carrier gas and reactant vapor through the vessel 100 and an associated vapor phase reaction chamber. The illustrated gas interface assembly 180 includes a plurality of valves 182 (which can perform substantially the same functions as the valves 170, 172, 176, and 178 of FIG. 19), a downstream purifier or filter 184, and a heater plate 186. The valves 182 can include valve porting blocks 188 similar in principle and operation to the valve porting blocks 118 and 120.

With reference to FIGS. 7 and 19, a gas line 133 extends from one of the valves 182 that receives carrier gas from a carrier gas source 164. For example, the valve 182 from which the gas line 133 extends can perform substantially the function of valve 170 of FIG. 19. FIG. 7 does not show the gas line extending into such a valve from the carrier gas source, but it will be understood to be provided. The gas line 133 includes a fitting 131 that connects to the carrier gas inlet fitting 122 of the vessel 100 when the vessel and the gas interface assembly 180 are connected. An outlet 135 of the gas interface assembly 180 delivers gas to a reaction chamber 162. It will be understood that the source vessel's carrier gas inlet could be configured to be similar to the outlet orifice 128.

With continued reference to FIG. 7, the heater plate 186 heats up the valves 182 and the vessel 100, preferably to a temperature above the vaporization temperature of the precursor. The high level of thermal contact between the various valves, valve porting blocks, and gas conduits of the preferred embodiment, as well as the proximity of the heater plate 186 to these components, reduces the total heat required to prevent condensation of the precursor in the gas-conveying components downstream of the vessel 100. The heater plate 186 can be heated by a variety of different types of heaters, such as cartridge heaters or line heaters. The heater plate can be formed of a variety of materials, such as aluminum, stainless steel, titanium, or various nickel alloys. Thermofoil-type heaters can also be used to heat the heater plate 186 and valve porting blocks 188. The use of a thermofoil-type heater can allow variable watt density or more than one temperature control zone. Incorporation of variable watt density or multiple temperature control zones on the heater plate 186 can make it possible to induce a temperature gradient along the flow path of the gas. This can provide a gradual heating of the reactant vapor as it moves downstream, so that condensation is avoided. Suitable thermofoil heaters are sold by Minco of Minneapolis, Minn. Additional heaters (including line heaters, cartridge heaters, radiant heat lamps, and thermofoil-type heaters) can also be provided to heat the vessel lid 106 and container body 104.

In certain embodiments, a dedicated heater can be provided to heat the vessel 100. In one particular embodiment, shown in FIG. 18 (described in further detail below), a dedicated heating device 220 is provided beneath a lower surface of the vessel's container body 104.

As mentioned above, precursor vapor can also be drawn from the vessel 100 by the "vapor draw" and external gas flow methods. In the vapor draw method, a vacuum is applied to the vessel 100 to draw out the vapor. For example, the vacuum can be applied downstream of the reaction chamber 162, with the valves 110, 176, and 178 open and the valves 108, 170, and 172 closed. The vacuum can be applied, for example, by using a vacuum pump. In the external gas flow method, the precursor vapor can be drawn from the vessel 100 by flowing the carrier gas from the source 164 to the reaction chamber 162, with the valves 110, 172, 176, and 178 open and the valves 108 and 170 closed. Under certain conditions, this can create a pressure differential between the vessel 100 and the flow path of the carrier gas, which causes the precursor vapor to flow toward the reaction chamber.

Quick-Connection Assembly

With continued reference to FIG. 7, the quick-connection assembly 102 preferably facilitates quicker and easier loading, aligning, and connection of the precursor source vessel 100 to the gas interface assembly 180. The quick-connection assembly 102 is ergonomically friendly and facilitates replacement, recharging, and serviceability of the vessel 100. A variety of different types of quick-connection assemblies can be provided, keeping in mind these goals, and skilled artisans will understand that the illustrated assembly 102 is merely one embodiment. The quick-connection assembly 102 can be incorporated into the vacuum enclosure where the source vessel 100 and supporting control hardware are packaged.

Figure 20:
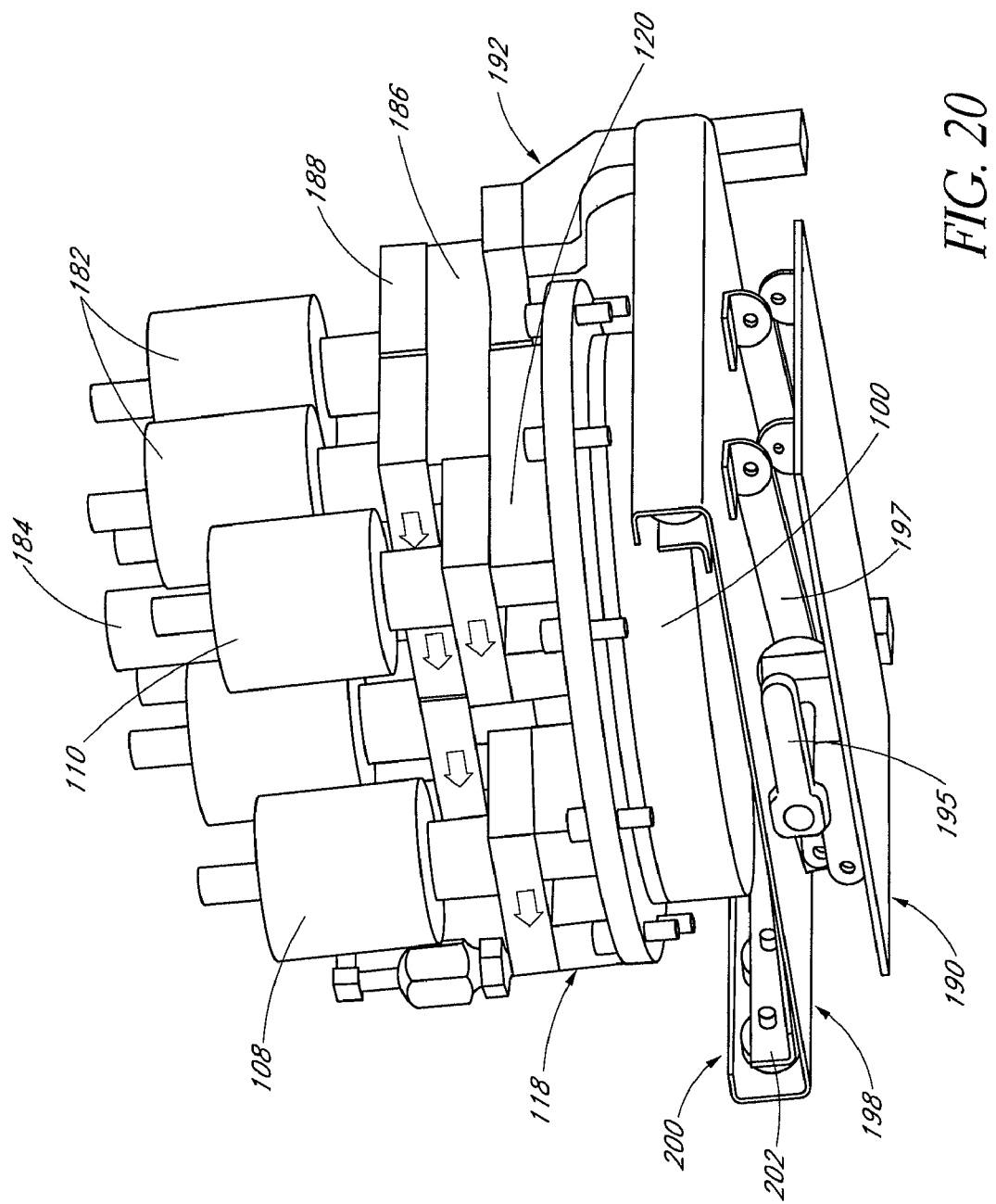
FIGS. 20 and 21 are front perspective views of the vessel and gas interface assembly of FIG. 7, shown connected.
Figure 21:
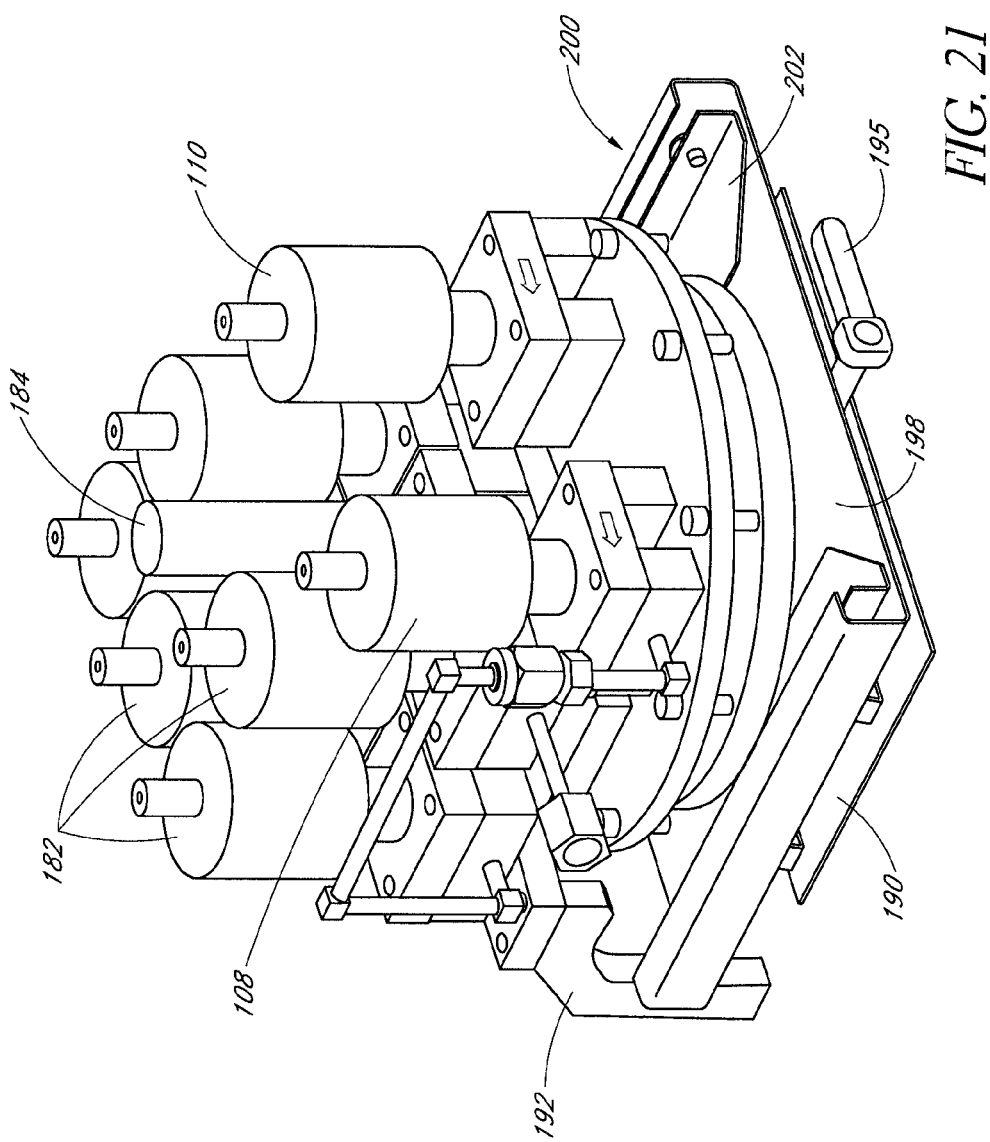

With reference to FIGS. 7, 20, and 21, the illustrated quick-connection assembly 102 includes a base 190, a pedestal 192 extending upward from an edge of the base 190, a track component 194, and a lift assembly 196. The base 190 can preferably be secured to a lower inner surface of the gas delivery system 6 (FIG. 1), such as on the floor 9 of the reactant source cabinet 16. Preferably, the pedestal 192 is connected to and supports the gas interface assembly 180 at a position above the base 190. The track component 194 includes a platform 198 and two roller tracks 200 on opposite sides of the platform 198. A pair of roller assemblies 202 having aligned rollers 204 is preferably secured to opposite sides of the vessel 100. In this embodiment, the rollers 204 are sized and configured to roll within the tracks 200 of the track component 194, so that the vessel 100 can be easily and quickly positioned on the platform 198.

When the vessel 100 is loaded onto the platform 198 with the roller assemblies 202 engaged with the tracks 200, the outlet of the outlet valve 110 is preferably vertically aligned with an inlet of one of the valves 182 of the gas interface assembly 180. The lift assembly 196 is configured to move the platform 198 vertically between lowered (shown in FIG. 7) and raised positions (shown in FIGS. 20-21). When the vessel 100 is loaded onto the platform 198 and the platform is moved to its raised position, the outlet of the outlet valve 110 preferably communicates, either directly or indirectly, with an inlet of one of the valves 182. A minimal degree of manual adjustment may be required to suitably seal the interface between the outlet of the outlet valve 110 and the inlet of the valve 182. In the illustrated embodiment, the outlet of the outlet valve 110 is an orifice 128 in the valve porting block 120. In this manner, the quick-connection assembly 102 enables quick connection of the precursor source vessel 100 and the gas interface assembly 180.

As shown in FIG. 20, the illustrated lift assembly 196 comprises a lift handle 195 that can manually actuate scissor legs 197 to vertically move the platform 198. For example, the handle 195 and legs 197 can operate in a manner that is similar to some existing auto jacks. In one embodiment, the lift assembly 196 lifts the platform 198 to its raised position when the handle 195 is rotated approximately 180°. However, it will be appreciated that other types of lift devices can alternatively be provided.

The quick-connection assembly 102 makes it easier to exchange a depleted vessel 100 with a new vessel. In addition, since the assembly 102 simplifies vessel removal and installation, it is also easier to perform routine maintenance on the vessel 100. Preferably, the weight of the vessel 100 is such that it can be easily managed by a single technician.

Figure 22:
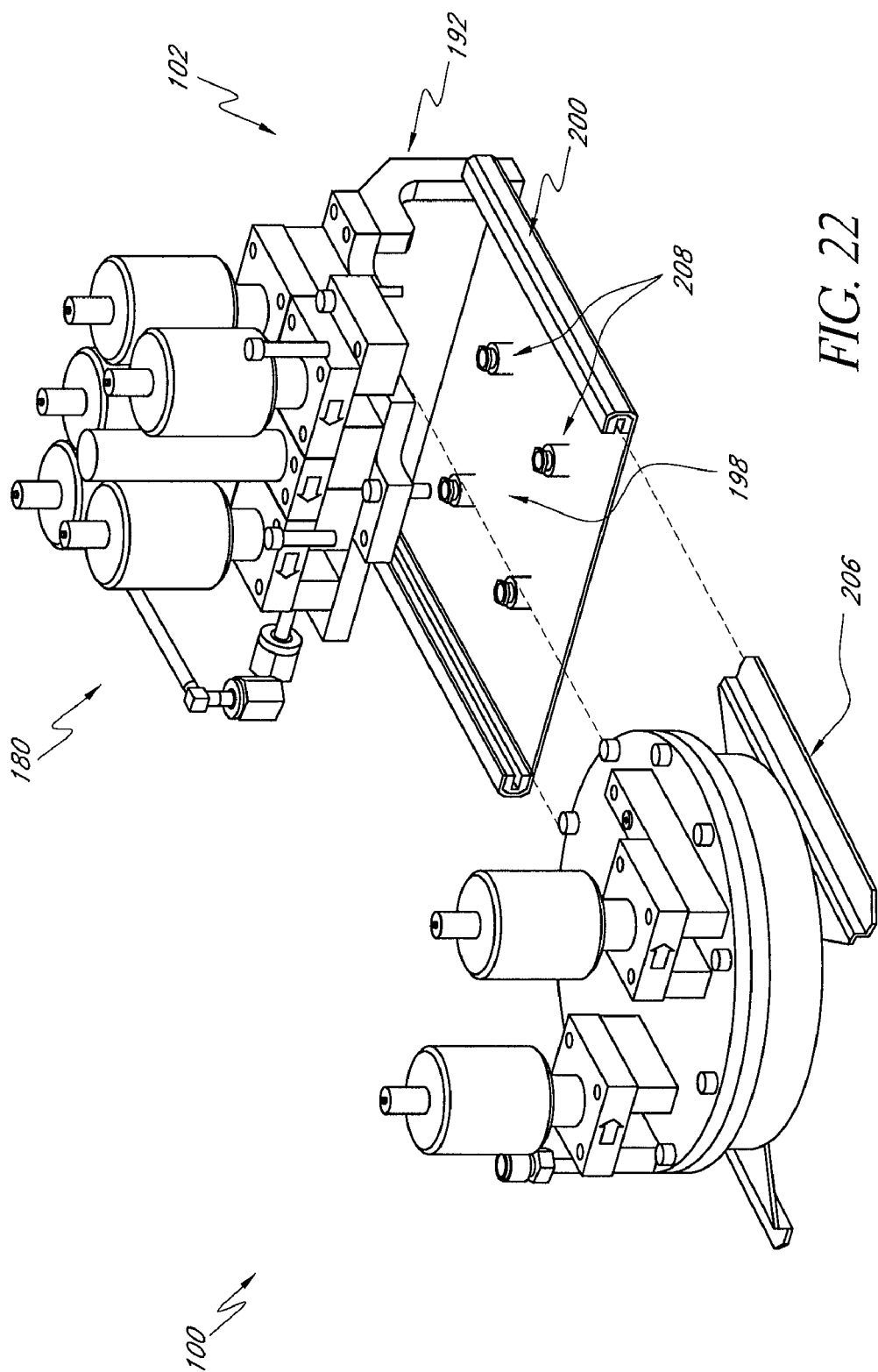
FIG. 22 is a top front perspective view of the precursor source vessel and gas interface assembly of FIG. 7, with an alternative embodiment of a quick-connection assembly.
Figure 23:
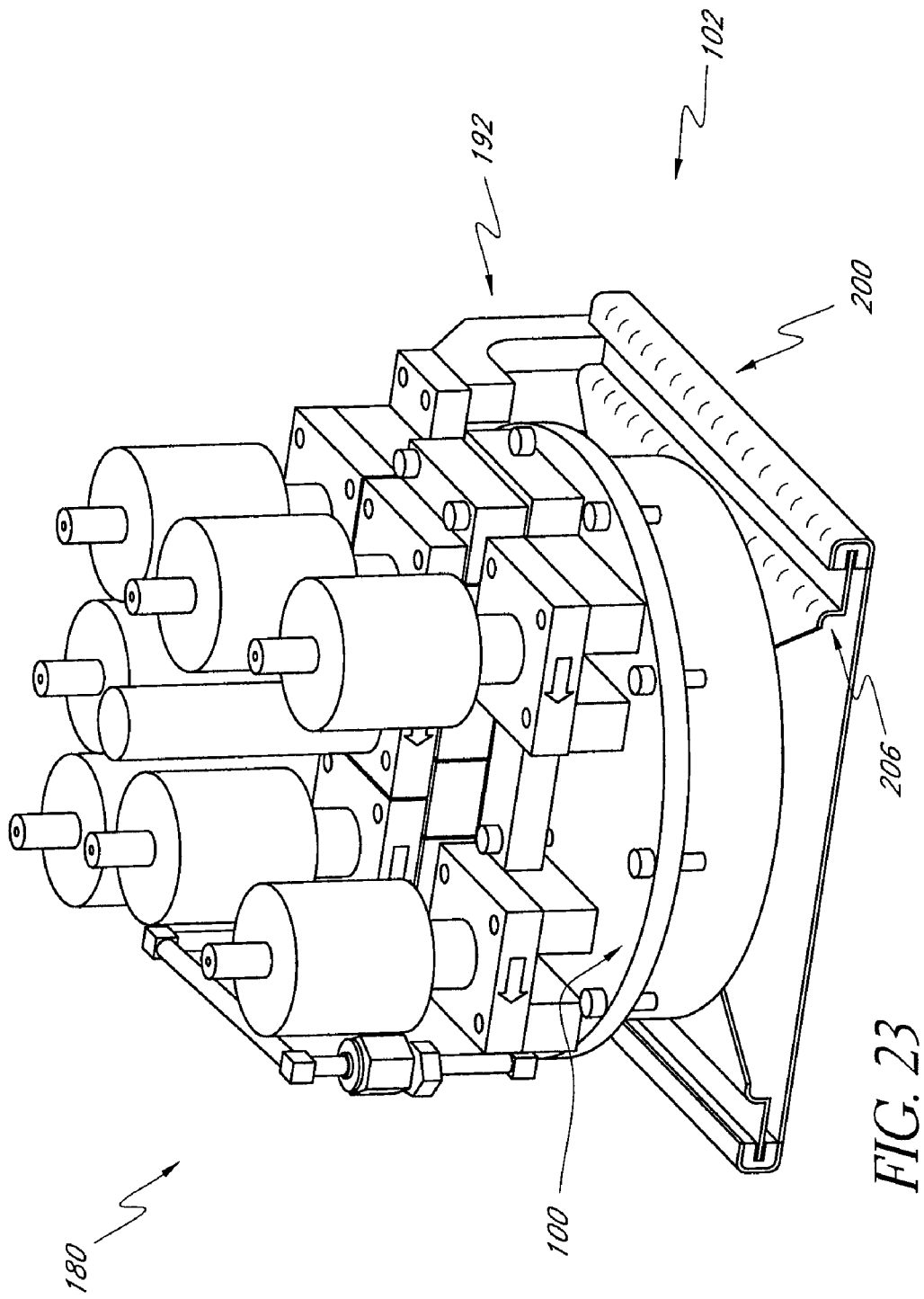
FIG. 23 is a top front perspective view of the vessel and gas interface assembly of FIG. 22, shown connected.
Figure 24:
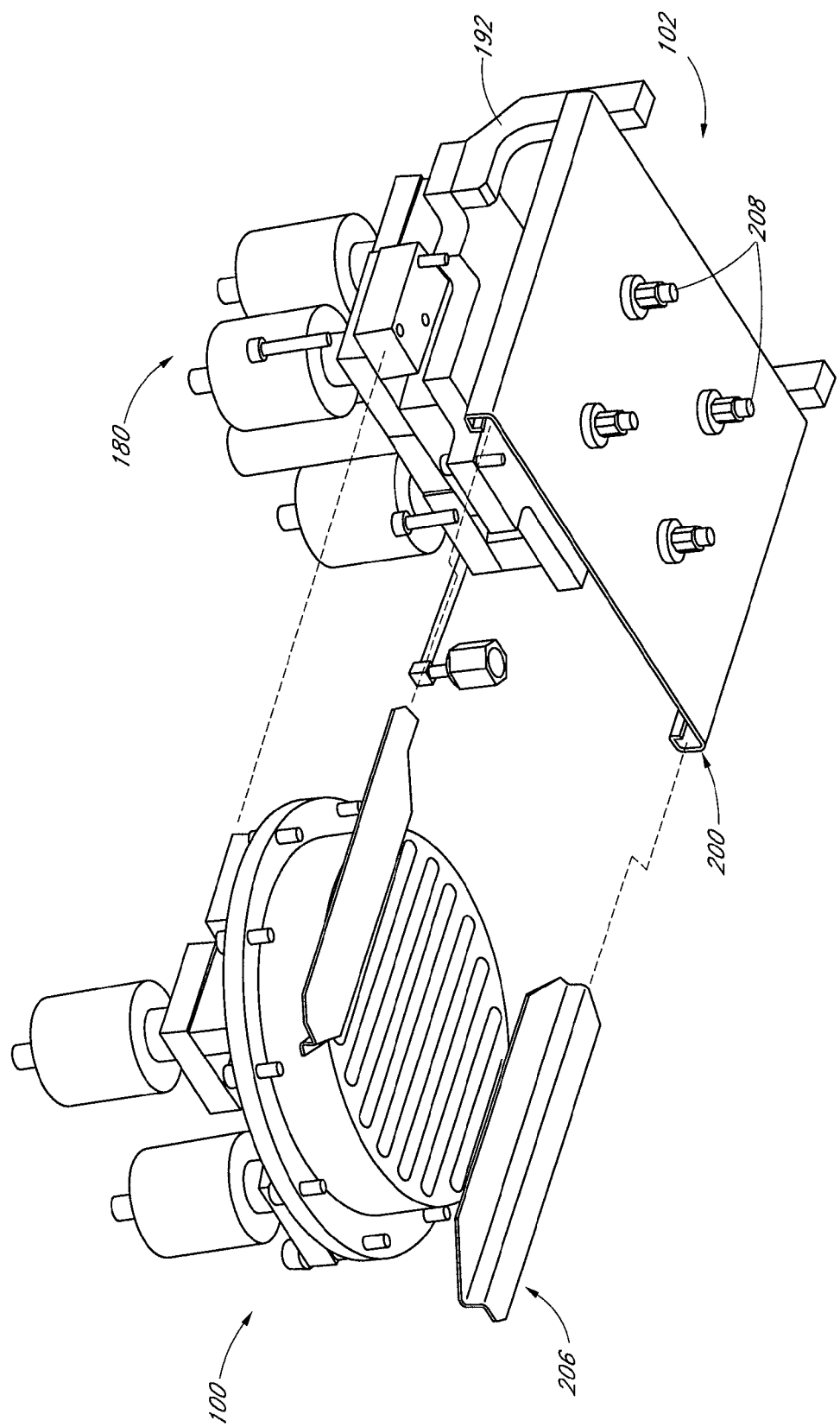
FIG. 24 is a bottom front perspective view of the vessel and gas interface assembly of FIG. 22, shown separated.

FIGS. 22-24 show an alternative embodiment of a quick-connection assembly 102. The illustrated assembly 102 includes the platform 198 and pedestal 192. The platform 198 includes tracks 200 adapted to receive tongues 206 attached on opposite sides of the vessel 100. One or more lift devices 208 are provided to raise the platform 198. In the illustrated embodiment, the lift devices 208 comprise bolts underneath the platform 198. The bolts can be turned to cause the platform 198 to rise to the connection position associated with the vessel 100. A guide apparatus (not shown) can be provided to maintain the vertical alignment of the platform 198.

Vent Valve

As mentioned above, precursor source vessels are typically supplied with a head pressure of inert gas (e.g., helium) in the vessel. During venting of this head pressure down to typical process pressures, solid precursor particles become aerosolized and entrained in the inert gas outflow. This can contaminate the gas delivery system because such gas is typically vented out through the vessel's outlet isolation valve, the reactant gas delivery system, and ultimately the reactor's exhaust/scrubber. Later, during substrate processing, the contaminated portions of the gas panel that are common to the precursor delivery path and the vent path can cause processing defects during ALD on the substrate.

Figure 25:
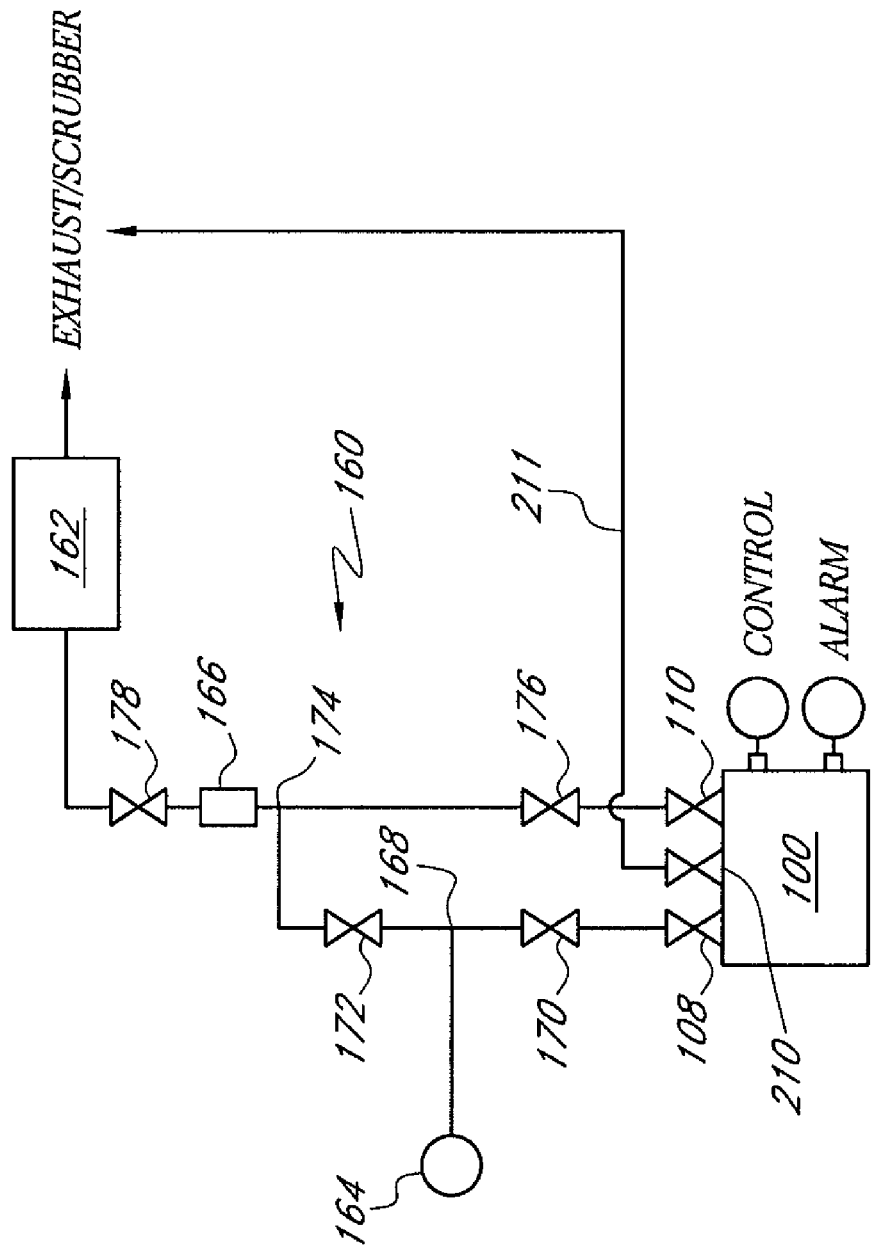
FIG. 25 is a schematic illustration of the gas delivery system of FIG. 19, with a vent valve and dedicated vent line added to the precursor source vessel.

In a preferred embodiment, this problem is substantially overcome by providing an additional vent valve on the precursor source vessel and a dedicated vent line in the gas delivery system for releasing the head pressure of gas inside the vessel, prior to processing. FIGS. 25-28 illustrate an embodiment of this aspect of the invention. FIG. 25 is a schematic illustration of the gas delivery system 160 of FIG. 19, with a vessel vent value 210 added to the precursor source vessel 100, and a dedicated vent line 211 connected to the vent valve 210. The illustrated vent line 211 extends directly to the exhaust/scrubber. The vented gas can be released substantially without contaminating the gas delivery system that forms the path for precursor delivery to the reaction chamber 162, such as the components 110, 176, 166, 178 or the gas lines therebetween.

A surface mount flow restrictor can be added to the vessel vent valve 210 to reduce the vent flow velocity, thus reducing turbulence that might otherwise stir up the precursor source (e.g., a powder). Suitable surface mount flow restrictors are sold by Mott Corporation of Farmington, Conn., also known as GSMR restrictors.

Figure 26:
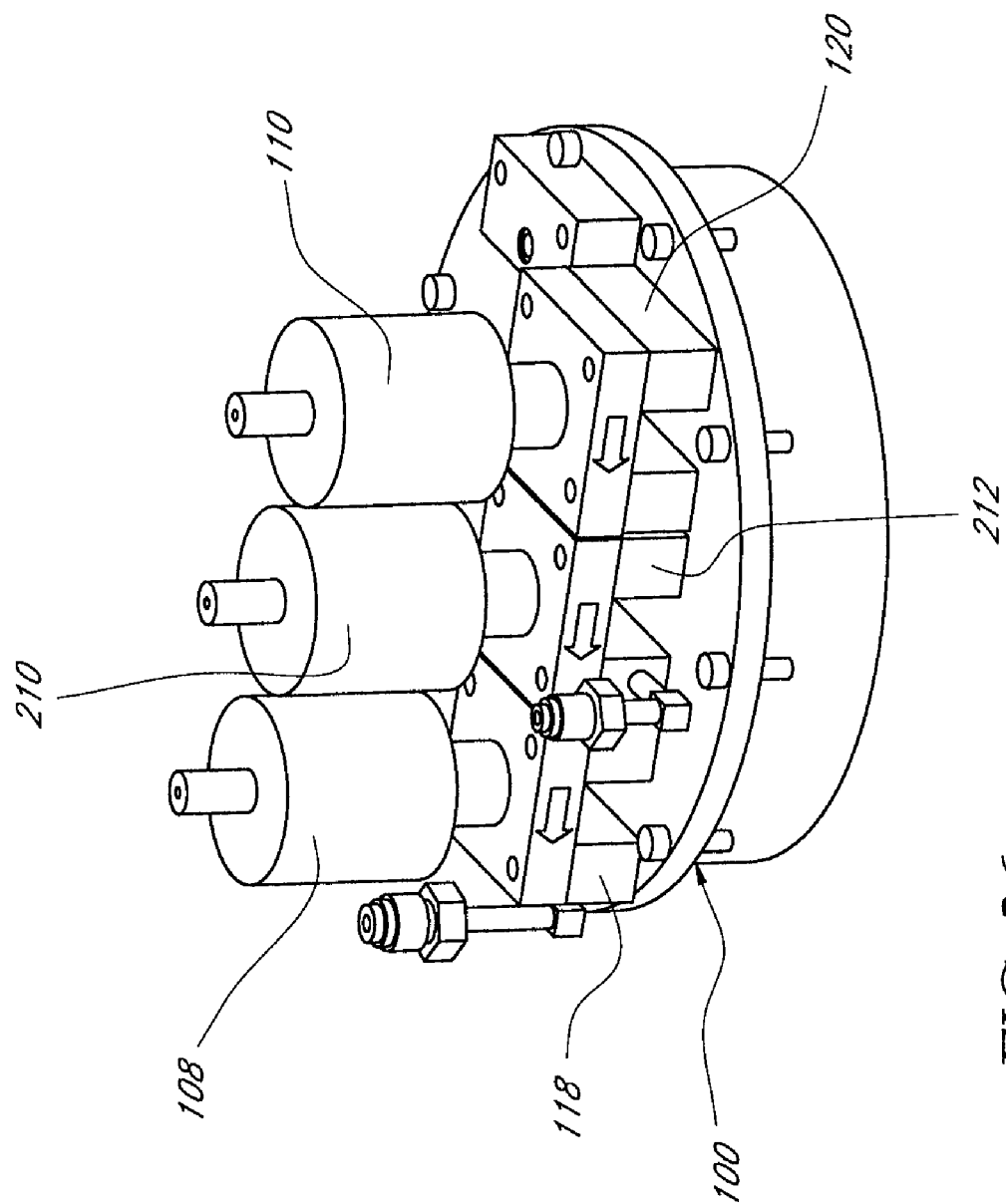
FIG. 26 is a perspective view of a precursor source vessel with a vent valve.
Figure 27:
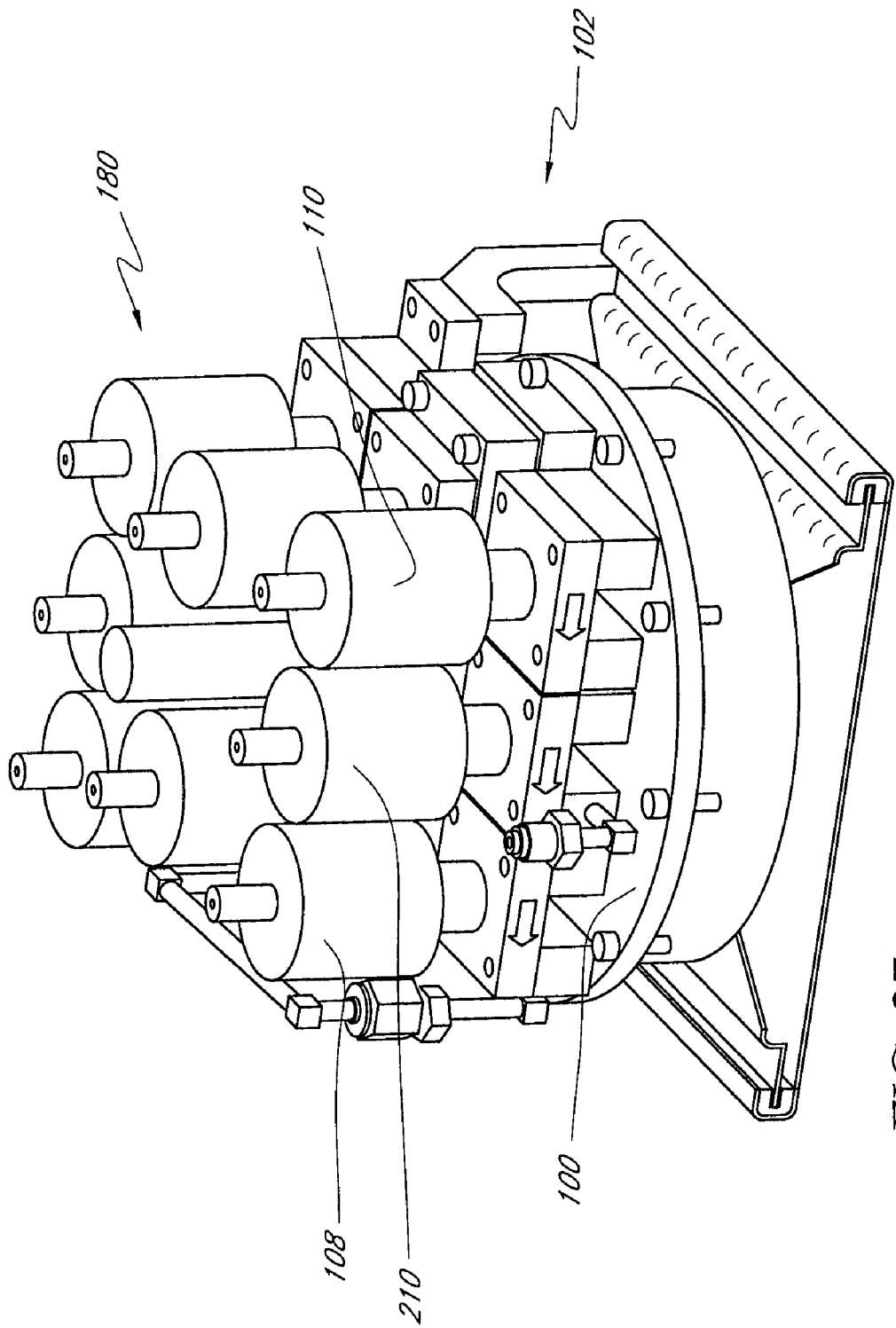
FIG. 27 is a perspective view of the vessel of FIG. 26 connected to the gas interface assembly of FIGS. 22-24.

FIG. 26 shows an example of a precursor source vessel 100 that includes a vent valve 210. In this embodiment, the vent valve 210 is positioned intermediate the inlet isolation valve 108 and the outlet isolation valve 110. However, skilled artisans will appreciate that other arrangements are possible. Preferably, the vent valve 210 includes a valve porting block 212, which can be substantially similar to the valve porting blocks 118 and 120. FIG. 27 shows the vessel 100 of FIG. 26 connected to the gas interface assembly of FIGS. 22-24, as described above.

Figure 28:
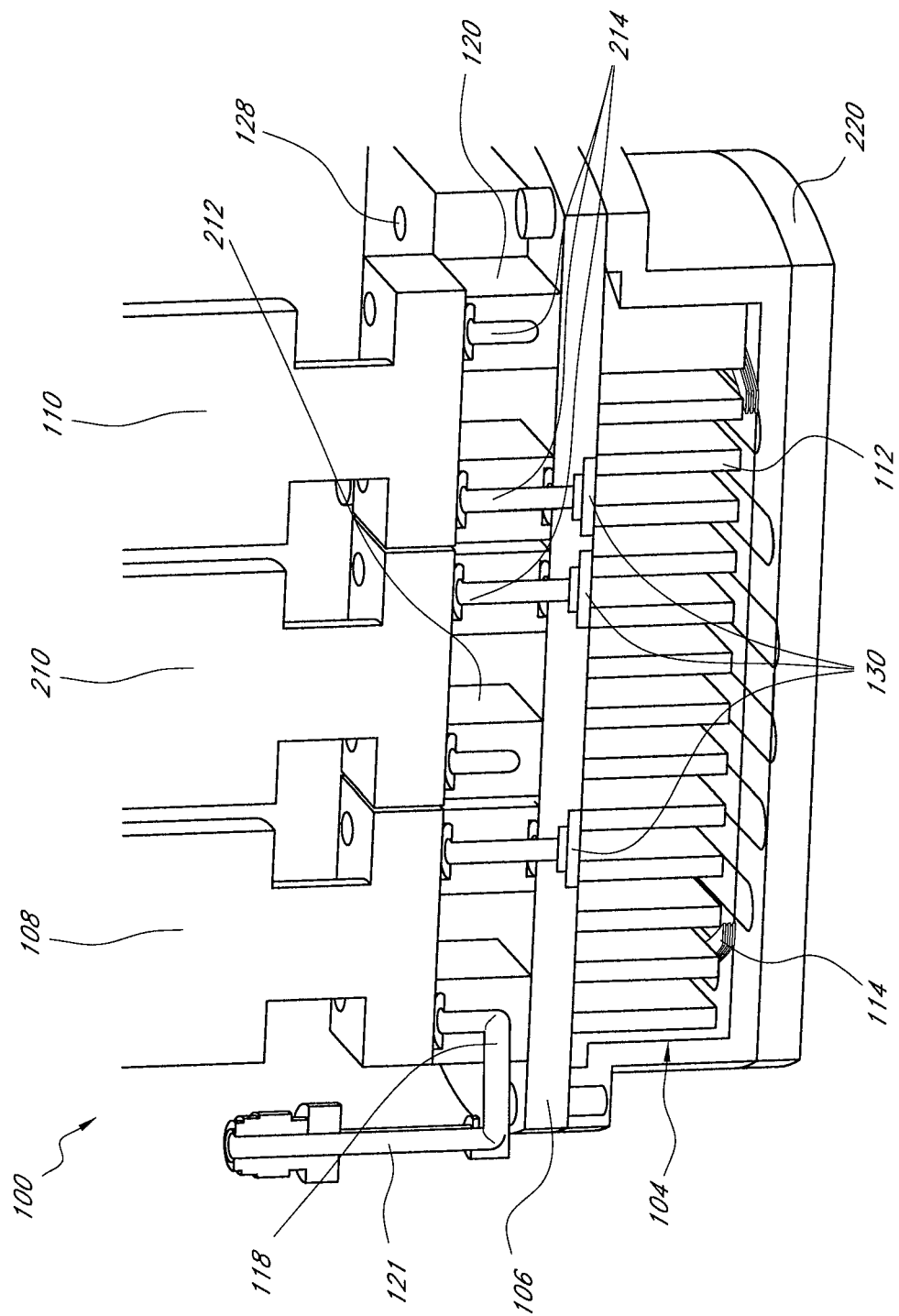
FIG. 28 is a sectional view of the vessel of FIG. 26, with the addition of a dedicated heating device for the vessel.

FIG. 28 is a sectional view of an embodiment of the vessel 100 of FIG. 26. As noted above, the vessel 100 includes a container body 104, a serpentine insert 112, a spring 114, a vessel lid 106. The vessel lid 106 includes the surface-mounted isolation valves 108 and 110, as well as the preferably surface-mounted isolation valve 210. Preferably, the valves 108, 210, and 110 include valve porting blocks 118, 212, and 120, respectively. FIG. 28 also shows internal gas passages 214 of the valve porting blocks. As noted above, the valve porting block 120 includes a gas outlet 128 that supplies the precursor vapor and carrier gas to the gas interface assembly 180.

A filter is preferably associated with each of the valves 108, 210, and 110. In the illustrated embodiment, the vessel lid 106 includes a filter 130 (e.g., as shown in FIG. 17 and described above) associated with each valve. It will be appreciated that a variety of different types of filters can be used. The filters prevent precursor particles from exciting the vessel 100.

Although the invention has been disclosed in the context of certain embodiments and examples, it will be understood by those skilled in the art that the invention extends beyond the specifically disclosed embodiments to other alternative embodiments and/or uses and obvious modifications and equivalents thereof. Accordingly, the invention is not intended to be limited by the specific disclosures of preferred embodiments herein.

What is claimed is:

1. A chemical reactant source vessel in combination with a gas delivery system for a vapor phase reactor for vapor processing of substrates, comprising:
    a vessel body defining an internal chamber adapted to contain a solid or liquid chemical reactant, wherein the vessel body includes an inlet and an outlet;
    an inlet passage within the vessel body, the inlet passage extending from outside the vessel body to the vessel chamber;
    an inlet valve attached directly to a substantially flat surface of the vessel body and configured to regulate flow through the inlet passage;
    an outlet passage within the vessel body, the outlet passage extending from the vessel chamber to outside the vessel body;
    an outlet valve attached directly to the substantially flat surface of the vessel body and configured to regulate flow through the outlet passage;
    a vapor phase reaction chamber for processing substrates;
    a plurality of gas panel valves collectively operative to convey a carrier gas through the vessel and into the reaction chamber, at least one of the gas panel valves being fluidly interposed between the outlet valve and the reaction chamber; and
    a heater plate interposed between the gas panel valves and the flat surface of the vessel body, the heater plate configured to heat up the gas panel valves and the vessel;
    wherein all of the gas panel valves are positioned within about 10.0 cm from the flat surface of the vessel body.

2. The vessel and gas delivery system combination of claim 1, wherein the inlet and outlet valves are each connected to the surface of the vessel body without any tubing between the valve and the surface of the vessel body.

3. The vessel and gas delivery system combination of claim 1, wherein the inlet and outlet valves are each at least partly integrally formed with the vessel body.

4. The vessel and gas delivery system combination of claim 1, wherein each of the inlet and outlet valves comprises:
    a valve porting block mounted to or integrally formed with the vessel body, the porting block defining a valve seat and including internal gas flow conduits defining the passage, the gas flow conduits being in fluid communication with the valve seat; and
    a movable flow restrictor adapted to block gas flow through the valve seat.

5. The vessel and gas delivery system combination of claim 1, wherein the vessel body comprises:
    a container body; and
    a vessel lid adapted to engage the body to define the chamber therebetween, the inlet and outlet passages being within the lid, the inlet and outlet valves being attached directly to the lid.

6. The vessel and gas delivery system combination of claim 1, wherein the chamber includes a tortuous path configured to contain the chemical reactant, the tortuous path extending from the inlet to the outlet.

7. The vessel and gas delivery system combination of claim 6, further comprising a serpentine insert within the chamber, the serpentine insert defining the tortuous path.

8. The vessel and gas delivery system combination of claim 6, further comprising a stack of trays within the chamber, the trays collectively defining a spiral gas flow path that comprises at least a portion of the tortuous path.

9. The vessel and gas delivery system combination of claim 6, wherein the tortuous path is machined into the container body or a lid of the vessel.

10. The vessel and gas delivery system combination of claim 1, wherein the gas panel valves are each positioned along a plane that is generally parallel to the flat surface of the vessel body, the plane being no more than about 10.0 cm from the flat surface of the vessel body.

11. The vessel and gas delivery system combination of claim 10, wherein the heater plate is interposed between the plane and the flat surface of the vessel body.

12. The vessel and gas delivery system combination of claim 10, wherein the plane is no more than about 7.5 cm from the flat surface of the vessel body.

13. The vessel and gas delivery system combination of claim 12, wherein the plane is no more than about 5.3 cm from the flat surface of the vessel body.

14. The vessel and gas delivery system combination of claim 1, wherein the gas panel valves are part of a gas panel comprising:
    a fluid conduit adapted to receive a carrier gas and convey the carrier gas to a first gas conduit connection point;
    a first gas panel valve fluidly interposed between the first gas conduit connection point and the inlet valve attached to the vessel;
    a second gas panel valve fluidly interposed between the first gas conduit connection point and a second gas conduit connection point;

a third gas panel valve fluidly interposed between the second gas conduit connection point and the outlet valve attached to the vessel; and a fourth gas panel valve fluidly interposed between the second gas conduit connection point and the reaction chamber.

15. The vessel and gas delivery system combination of claim 1, further comprising:

a vapor exhaust component downstream of the reaction chamber;

a vent passage extending through the vessel body from the vessel chamber to outside the vessel;

a vent valve attached directly to the vessel body and configured to regulate flow through the vent passage; and one or more conduits for delivering gas flow from the vent valve to the exhaust component without flowing through the reaction chamber.

16. The vessel and gas delivery system combination of claim 1, further comprising a filter in a wall of the vessel body, the filter adapted to prevent particulate matter from flowing through the outlet passage.

17. The vessel and gas delivery system combination of claim 16, wherein an inner surface of the wall includes a recess that receives the filter, the outlet passage having one end terminating in the recess and another end in fluid communication with the outlet valve, the filter comprising:

a flange having an inner annular wall defining an opening within the flange, the flange being positioned within the recess; and a filter material substantially filling the opening of the flange;

wherein gas within the internal chamber of the vessel body cannot flow through the outlet passage without flowing through the filter material and the opening within the flange.

18. The vessel and gas delivery system combination of claim 1, further comprising:

a first filter in a wall of the vessel body, the first filter adapted to prevent particulate matter from flowing through the inlet passage; and a second filter in the wall of the vessel body, the second filter adapted to prevent particulate matter from flowing through the outlet passage.

19. The vessel and gas delivery system combination of claim 18, wherein:

an inner surface of the vessel body wall includes a first recess that receives the first filter, and a second recess that receives the second filter;

the inlet passage has one end terminating in the first recess and another end in fluid communication with the inlet valve;

the outlet passage has one end terminating in the second recess and another end in fluid communication with the outlet valve;

the first filter comprises:

a first flange having an inner annular wall defining an opening within the first flange, the first flange being positioned within the first recess; and a first filter material substantially filling the opening of the first flange;

the second filter comprises:

a second flange having an inner annular wall defining an opening within the second flange, the second flange being positioned within the second recess; and a second filter material substantially filling the opening of the second flange;

the first filter is engaged with the first recess and configured so that gas cannot flow through the inlet passage without flowing through the first filter material and the opening within the first flange; and the second filter is engaged with the second recess and configured so that gas cannot flow through the outlet passage without flowing through the second filter material and the opening within the second flange.

* * * * *

UNITED STATES PATENT AND TRADEMARK OFFICE
CERTIFICATE OF CORRECTION

PATENT NO.        : 8,137,462 B2                                    Page 1 of 1
APPLICATION NO.   : 11/870374
DATED             : March 20, 2012
INVENTOR(S)       : Fondurulia et al.

It is certified that error appears in the above-identified patent and that said Letters Patent is hereby corrected as shown below:

In column 18, line 60, please replace "value" with -- valve --

In column 19, line 19, please replace both occurrences of "a" with -- and a --

In column 19, line 34, please replace "exciting" with -- exiting --

Signed and Sealed this
Twenty-fourth Day of July, 2012

David J. Kappos
*Director of the United States Patent and Trademark Office*